(12) United States Patent
Hosseini et al.

(10) Patent No.: US 11,581,982 B2
(45) Date of Patent: Feb. 14, 2023

(54) HANDLING TRANSPORT BLOCK-LEVEL PARITY CHECK BITS FOR INTERRUPTED TRANSMISSIONS

(71) Applicant: QUALCOMM Incorporated, San Diego, CA (US)

(72) Inventors: Seyedkianoush Hosseini, San Diego, CA (US); Amir Aminzadeh Gohari, Sunnyvale, CA (US); Jaeyoung Kwak, San Jose, CA (US); Peter Gaal, San Diego, CA (US); Aamod Khandekar, San Diego, CA (US); Joseph Binamira Soriaga, San Diego, CA (US); Tingfang Ji, San Diego, CA (US); Wanshi Chen, San Diego, CA (US); Enoch Shiao-Kuang Lu, San Diego, CA (US); Gabi Sarkis, San Diego, CA (US); Chao Jin, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 268 days.

(21) Appl. No.: 16/863,903

(22) Filed: Apr. 30, 2020

(65) Prior Publication Data

US 2020/0351027 A1 Nov. 5, 2020

Related U.S. Application Data

(60) Provisional application No. 62/890,037, filed on Aug. 21, 2019, provisional application No. 62/843,244, filed on May 3, 2019.

(51) Int. Cl.
*H04L 1/18* (2006.01)
*H04L 1/1812* (2023.01)
(Continued)

(52) U.S. Cl.
CPC .......... *H04L 1/1812* (2013.01); *H04L 1/0041* (2013.01); *H04L 1/0061* (2013.01); *H04L 1/1864* (2013.01)

(58) Field of Classification Search
CPC ... H04L 1/1812; H04L 1/0041; H04L 1/0061; H04L 1/1864; H04L 1/18; H04L 1/0067;
(Continued)

(56) References Cited

U.S. PATENT DOCUMENTS

2010/0205518 A1  8/2010  Golitschek Edler Von Elbwart et al.
2017/0279464 A1* 9/2017  Noh ................. H03M 13/09
(Continued)

OTHER PUBLICATIONS

CATT: "Discussion On out-of-order Scheduling/HARQ", 3GPP Draft, 3GPP TSG RAN WG1 Meeting #96bis, R1-1905362, 3rd Generation Partnership Project (3GPP), Mobile Competence Centre, 650, Route Des Lucioles, F-06921, Sophia-Antipolis Cedex, France, Apr. 12, 2019 (Apr. 12, 2019), 5 pages, XP051707436, the whole document.
(Continued)

*Primary Examiner* — Kwang B Yao
*Assistant Examiner* — Syed M Bokhari
(74) *Attorney, Agent, or Firm* — Holland & Hart LLP

(57) ABSTRACT

Methods, systems, and devices for wireless communications are described. In some systems, a base station may interrupt a user equipment (UE) during transport block (TB) encoding. The UE may cancel transmission (e.g., suppress processing) of a TB based on the interruption, such that a first subset of code blocks is encoded and a second subset is unencoded. In some cases, the UE may receive a re-transmission request for a code block including cyclic redundancy check (CRC) bits for the TB, where the CRC bits are not prepared. In one example, the UE may modify the CRC bits (e.g., set them to a common value, drop them, etc.) to
(Continued)

reduce processing time. In another example, the base station may request re-transmission of all preempted code blocks, supporting TB CRC calculation. In another example, the base station or UE may extend a processing timeline for the re-transmission to support TB CRC calculation.

23 Claims, 19 Drawing Sheets

(51) Int. Cl.
  H04L 1/00        (2006.01)
  H04L 1/1829      (2023.01)
(58) Field of Classification Search
  CPC . H03M 13/6306; H03M 13/635; H03M 13/09
  USPC .......................................................... 370/330
  See application file for complete search history.

(56) References Cited

U.S. PATENT DOCUMENTS

| | | | | |
|---|---|---|---|---|
| 2018/0109355 A1* | 4/2018 | Werner | ................. | H04L 1/0089 |
| 2018/0269899 A1* | 9/2018 | Noh | ................. | H03M 13/2906 |
| 2019/0181986 A1* | 6/2019 | Kitamura | .............. | H04L 5/0007 |
| 2020/0220663 A1* | 7/2020 | Tsai | ....................... | H04L 1/1864 |
| 2021/0119738 A1* | 4/2021 | Yeo | ........................ | H04L 1/1896 |
| 2021/0135791 A1* | 5/2021 | Wang | ..................... | H04L 1/0075 |
| 2021/0167899 A1* | 6/2021 | Balasubramanian | ........................ | H04L 1/1825 |
| 2021/0176758 A1* | 6/2021 | Bae | ....................... | H04L 1/1819 |

OTHER PUBLICATIONS

Intel Corporation: "On Inter-UE UL Multiplexing for eURLLC", 3GPP Draft, 3GPP TSG RAN WG1 Meeting #96, R1-1902497 INTEL—UL Inter-UE MUX, 3rd Generation Partnership Project (3GPP), Mobile Competence Centre, 650, Route Des Lucioles, F-06921 Sophia-Antipolis Cedex, France, vol. RAN WG1, No. Athens, Greece, Feb. 25, 2019-Mar. 1, 2019, Feb. 16, 2019 (Feb. 16, 2019), XP051600193, 12 pages, Retrieved from the Internet: URL: http://www.3gpp.org/ftp/tsg%5Fran/WG1%5FRL1/TSGR1%5F96/Docs/R1%2D1902497%2Ezip, [retrieved on Feb. 16, 2019], p. 6.
International Search Report and Written Opinion—PCT/US2020/031103—ISA/EPO—dated Nov. 23, 2020.
ZTE: "On scheduling/HARQ Processing Timeline for URLLC," 3GPP Draft, 3GPP TSG RAN WG1 Ad-Hoc Meeting 1901, R1-1900072, On Scheduling&Harq Processing Timeline, 3rd Generation Partnership Project (3GPP), Mobile Competence Centre, 650, Route Des Lucioles, F-06921, Sophia-Antipolis Cedex, France, vol. RAN WG1, No. Taipei; Jan. 21, 2019-Jan. 25, 2019, Jan. 20, 2019 (Jan. 20, 2019), XP051592998, 18 pages, Retrieved from the Internet: URL: http://www.3gpp.org/ftp/Meetings%5F3GPP%5FSYNC/RAN1/Docs/R1%2D1900072%2Ezip [retrieved on Jan. 20, 2019] the whole document.
CMCC: "Discussion on UL Inter UE Tx Prioritization/Multiplexing", 3GPP Draft, 3GPP TSG RAN WG1 #97 R1-1906520, 3rd Generation Partnership Project (3GPP), Mobile Competence Centre, 650, Route Des Lucioles, F-06921 Sophia-Antipolis Cedex, France, vol. RAN WG1, No. Reno, USA, May 13, 2019-May 17, 2019, May 2, 2019 (May 2, 2019), XP051708555, 6 Pages, Retrieved from the Internet: URL: http://www.3gpp.org/ftp/tsg%5Fran/WG1%5FRL1/TSGR1%5F97/Docs/R1%2D1906520%2Ezip, [retrieved on May 2, 2019], the whole document.
Hwang S Y., et al., "Implementation of an Encoder Based on Parallel Structure for LTE Systems", Wireless Communications and Networking Conference (WCNC), 2010 IEEE, IEEE, Piscataway, NJ, USA, Apr. 18, 2010 (Apr. 18, 2010), pp. 1-6, XP031706374, ISBN: 978-1-4244-6396-1, Section II, p. 2-p. 5, figures 2, 9.
Partial International Search Report—PCT/US2020/031103—ISAEPO—dated Aug. 14, 2020.
Qualcomm Incorporated: "UCI Enhancements for eURLLC", 3GPP Draft, 3GPP TSG-RAN WG1 #99, R1-1912960, 3rd Generation Partnership Project (3GPP), Mobile Competence Centre, 650, Route Des Lucioles, F-06921 Sophia-Antipolis Cedex, France, vol. RAN WG1, No. Reno, Nevada, USA, Nov. 18, 2019-Nov. 22, 2019, Nov. 9, 2019 (Nov. 9, 2019), XP051823722, pp. 1-12, Retrieved from the Internet: URL: https://ftp.3gpp.org/tsg_ran/WG1_RL1/TSGR1_99/Docs/R1-1912960.zip, R1-1912960 UCI Enhancements for eURLLC. docx, [retrieved on Nov. 9, 2019], Section 4, p. 11.

\* cited by examiner

US 11,581,982 B2

HANDLING TRANSPORT BLOCK-LEVEL PARITY CHECK BITS FOR INTERRUPTED TRANSMISSIONS

CROSS REFERENCES

The present Application for Patent claims the benefit of U.S. Provisional Patent Application No. 62/843,244 by Hosseini et al., entitled "HANDLING TRANSPORT BLOCK-LEVEL PARITY CHECK BITS FOR INTERRUPTED TRANSMISSIONS," filed May 3, 2019, and U.S. Provisional Patent Application No. 62/890,037 by HOSSEINI et al., entitled "HANDLING TRANSPORT BLOCK-LEVEL PARITY CHECK BITS FOR INTERRUPTED TRANSMISSIONS," filed Aug. 21, 2019, each of which is assigned to the assignee hereof, and each of which is expressly incorporated by reference in its entirety herein.

BACKGROUND

The following relates generally to wireless communications, and more specifically to uplink re-transmission handling.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM). A wireless multiple-access communications system may include a number of base stations or network access nodes, each simultaneously supporting communication for multiple communication devices, which may be otherwise known as user equipment (UE).

In some wireless communications systems, a base station may fail to receive or decode a portion of an uplink transmission from a UE (e.g., due to poor channel quality, interference on the channel, and the like). In these cases, the base station may transmit a re-transmission request message to the UE, and the UE may re-transmit the information. For example, the base station may request for the UE to re-transmit the entire uplink transmission or may request for the UE to re-transmit a specific portion (e.g., the missed portion) of the uplink transmission. Uplink re-transmission operations may improve communications in systems with unreliable uplink communication channels.

SUMMARY

The described techniques relate to improved methods, systems, devices, and apparatuses that support handling transport block (TB)-level parity check bits for interrupted transmissions. Generally, the described techniques provide for processing operations that enable a user equipment (UE) to meet a re-transmission processing timeline if an initial TB transmission is interrupted and the code block processing is suspended. For example, in some wireless communications systems, a base station may interrupt a UE during TB encoding. The UE may suppress processing (e.g., cancel transmission) of the TB based on the interruption, such that a first subset of code blocks of the TB is encoded for transmission, while a second subset of code blocks of the TB remains unencoded for transmission. If the UE receives a re-transmission request for a code block including parity check information (e.g., cyclic redundancy check (CRC) bits) for the TB, where a current state of the TB CRC bits does not correspond to the second subset of code blocks due to the halted TB encoding process (e.g., the canceled transmission of the TB), the UE may implement one or more techniques to handle the re-transmission request.

In a first example, the UE may modify the code block (e.g., set the CRC bits to a common value or drop the CRC bits) to reduce processing time. In a second example, the base station may request re-transmission of all preempted code blocks (e.g., all unencoded code blocks, all code blocks of the TB, or the entire TB), supporting CRC calculation for the TB. In a third example, the base station or UE may extend a processing timeline for a transmission (e.g., for the re-transmission or for a higher priority transmission preempting the initial TB transmission), such that the allotted processing time supports TB CRC calculation at the UE.

A method for wireless communications at a UE is described. The method may include canceling transmission of a TB including a set of code blocks, where a first subset of code blocks of the set of code blocks is encoded for transmission and a second subset of code blocks of the set of code blocks is unencoded for transmission based on the canceling, receiving a re-transmission request for a code block of the second subset of code blocks including a set of parity check bits for the TB, determining that a current state of the set of parity check bits for the TB corresponds to the first subset of code blocks based on the canceling, modifying the code block including the set of parity check bits for the TB based on the determining, and transmitting the modified code block based on the re-transmission request.

An apparatus for wireless communications at a UE is described. The apparatus may include a processor, memory in electronic communication with the processor, and instructions stored in the memory. The instructions may be executable by the processor to cause the apparatus to cancel transmission of a TB including a set of code blocks, where a first subset of code blocks of the set of code blocks is encoded for transmission and a second subset of code blocks of the set of code blocks is unencoded for transmission based on the canceling, receive a re-transmission request for a code block of the second subset of code blocks including a set of parity check bits for the TB, determine that a current state of the set of parity check bits for the TB corresponds to the first subset of code blocks based on the canceling, modify the code block including the set of parity check bits for the TB based on the determining, and transmit the modified code block based on the re-transmission request.

Another apparatus for wireless communications at a UE is described. The apparatus may include means for canceling transmission of a TB including a set of code blocks, where a first subset of code blocks of the set of code blocks is encoded for transmission and a second subset of code blocks of the set of code blocks is unencoded for transmission based on the canceling, receiving a re-transmission request for a code block of the second subset of code blocks including a set of parity check bits for the TB, determining that a current state of the set of parity check bits for the TB corresponds to the first subset of code blocks based on the canceling, modifying the code block including the set of parity check bits for the TB based on the determining, and transmitting the modified code block based on the re-transmission request.

A non-transitory computer-readable medium storing code for wireless communications at a UE is described. The code may include instructions executable by a processor to cancel transmission of a TB including a set of code blocks, where a first subset of code blocks of the set of code blocks is encoded for transmission and a second subset of code blocks of the set of code blocks is unencoded for transmission based on the canceling, receive a re-transmission request for a code block of the second subset of code blocks including a set of parity check bits for the TB, determine that a current state of the set of parity check bits for the TB corresponds to the first subset of code blocks based on the canceling, modify the code block including the set of parity check bits for the TB based on the determining, and transmit the modified code block based on the re-transmission request.

In some examples of the method, apparatuses, and non-transitory computer-readable medium described herein, the modifying may include operations, features, means, or instructions for setting each bit of the set of parity check bits for the TB to a common bit value based on the determining. In some examples of the method, apparatuses, and non-transitory computer-readable medium described herein, the common bit value may be a zero bit value or a one bit value.

In some examples of the method, apparatuses, and non-transitory computer-readable medium described herein, the modifying may include operations, features, means, or instructions for removing the set of parity check bits for the TB from the code block based on the determining. In some examples of the method, apparatuses, and non-transitory computer-readable medium described herein, the modifying further may include operations, features, means, or instructions for rate-matching the code block based on removing the set of parity check bits for the TB from the code block.

Some examples of the method, apparatuses, and non-transitory computer-readable medium described herein may further include operations, features, means, or instructions for receiving a message preempting the transmission of the TB, where the canceling may be based on receiving the message. In some examples of the method, apparatuses, and non-transitory computer-readable medium described herein, the transmission of the TB may be based on a first grant and the message preempting the transmission of the TB includes a second grant for a second transmission overlapping at least one time resource of the first grant. In some other examples of the method, apparatuses, and non-transitory computer-readable medium described herein, the transmission of the TB may be based on a first grant and the message preempting the transmission of the TB requests the UE to refrain from transmitting in at least one time resource of the first grant.

Some examples of the method, apparatuses, and non-transitory computer-readable medium described herein may further include operations, features, means, or instructions for transmitting, for the TB, the first subset of code blocks based on the first subset of code blocks being encoded for transmission. In some examples of the method, apparatuses, and non-transitory computer-readable medium described herein, the transmitting, for the TB, the first subset of code blocks may be an initial transmission of the TB by the UE.

In some examples of the method, apparatuses, and non-transitory computer-readable medium described herein, the set of parity check bits may be a set of CRC bits.

A method for wireless communications at a base station is described. The method may include receiving, from a UE, a first subset of code blocks of a TB, where transmission of the TB is scheduled for a first set of resources, transmitting a message indicating a second set of resources overlapping in time with at least a portion of the first set of resources, determining that transmission of a second subset of code blocks of the TB by the UE is preempted based on the message, where the second subset of code blocks includes a code block including a set of parity check bits for the TB, and requesting re-transmission of at least the second subset of code blocks based on the determining.

An apparatus for wireless communications at a base station is described. The apparatus may include a processor, memory in electronic communication with the processor, and instructions stored in the memory. The instructions may be executable by the processor to cause the apparatus to receive, from a UE, a first subset of code blocks of a TB, where transmission of the TB is scheduled for a first set of resources, transmit a message indicating a second set of resources overlapping in time with at least a portion of the first set of resources, determine that transmission of a second subset of code blocks of the TB by the UE is preempted based on the message, where the second subset of code blocks includes a code block including a set of parity check bits for the TB, and request re-transmission of at least the second subset of code blocks based on the determining.

Another apparatus for wireless communications at a base station is described. The apparatus may include means for receiving, from a UE, a first subset of code blocks of a TB, where transmission of the TB is scheduled for a first set of resources, transmitting a message indicating a second set of resources overlapping in time with at least a portion of the first set of resources, determining that transmission of a second subset of code blocks of the TB by the UE is preempted based on the message, where the second subset of code blocks includes a code block including a set of parity check bits for the TB, and requesting re-transmission of at least the second subset of code blocks based on the determining.

A non-transitory computer-readable medium storing code for wireless communications at a base station is described. The code may include instructions executable by a processor to receive, from a UE, a first subset of code blocks of a TB, where transmission of the TB is scheduled for a first set of resources, transmit a message indicating a second set of resources overlapping in time with at least a portion of the first set of resources, determine that transmission of a second subset of code blocks of the TB by the UE is preempted based on the message, where the second subset of code blocks includes a code block including a set of parity check bits for the TB, and request re-transmission of at least the second subset of code blocks based on the determining.

In some examples of the method, apparatuses, and non-transitory computer-readable medium described herein, requesting re-transmission further may include operations, features, means, or instructions for transmitting one or more re-transmission request messages for a set of code block groups (CBGs) including at least the second subset of code blocks, where a re-transmission request message for a CBG including the code block with the set of parity check bits for the TB may be transmitted subsequent to each other re-transmission request message of the one or more re-transmission request messages. In some examples of the method, apparatuses, and non-transitory computer-readable medium described herein, requesting re-transmission further may include operations, features, means, or instructions for requesting re-transmission of each code block of the TB based on the determining.

In some examples of the method, apparatuses, and non-transitory computer-readable medium described herein, requesting re-transmission further may include operations, features, means, or instructions for requesting re-transmission of the TB based on the determining. In some examples of the method, apparatuses, and non-transitory computer-readable medium described herein, requesting re-transmission of the TB may include operations, features, means, or instructions for requesting re-transmission of the TB based on a configuration of the base station, where the configuration enables preemption of transmissions by the UE and disables CBG-level re-transmission requests by the base station.

In some examples of the method, apparatuses, and non-transitory computer-readable medium described herein, the determining further may include operations, features, means, or instructions for identifying the second subset of code blocks based on the second subset of code blocks being scheduled for transmission at least partially overlapping in time with the second set of resources.

In some examples of the method, apparatuses, and non-transitory computer-readable medium described herein, the message indicating the second set of resources includes a grant for a second transmission in the second set of resources. In some other examples of the method, apparatuses, and non-transitory computer-readable medium described herein, the message indicating the second set of resources requests the UE to refrain from transmitting in the second set of resources.

In some examples of the method, apparatuses, and non-transitory computer-readable medium described herein, the set of parity check bits may be a set of CRC bits. In some examples of the method, apparatuses, and non-transitory computer-readable medium described herein, the transmission of the TB may be an initial transmission of the TB by the UE.

A method for wireless communications at a UE is described. The method may include canceling transmission of a TB including a set of code blocks, where a first subset of code blocks of the set of code blocks is encoded for transmission and a second subset of code blocks of the set of code blocks is unencoded for transmission based on the canceling, receiving a re-transmission request for a code block of the second subset of code blocks including a set of parity check bits for the TB, modifying a processing timeline based on the second subset of code blocks being unencoded for transmission, encoding the second subset of code blocks for transmission based on the modified processing timeline, and transmitting the code block based on the re-transmission request and encoding the second subset of code blocks for transmission.

An apparatus for wireless communications at a UE is described. The apparatus may include a processor, memory in electronic communication with the processor, and instructions stored in the memory. The instructions may be executable by the processor to cause the apparatus to cancel transmission of a TB including a set of code blocks, where a first subset of code blocks of the set of code blocks is encoded for transmission and a second subset of code blocks of the set of code blocks is unencoded for transmission based on the canceling, receive a re-transmission request for a code block of the second subset of code blocks including a set of parity check bits for the TB, modify a processing timeline based on the second subset of code blocks being unencoded for transmission, encode the second subset of code blocks for transmission based on the modified processing timeline, and transmit the code block based on the re-transmission request and encoding the second subset of code blocks for transmission.

Another apparatus for wireless communications at a UE is described. The apparatus may include means for canceling transmission of a TB including a set of code blocks, where a first subset of code blocks of the set of code blocks is encoded for transmission and a second subset of code blocks of the set of code blocks is unencoded for transmission based on the canceling, receiving a re-transmission request for a code block of the second subset of code blocks including a set of parity check bits for the TB, modifying a processing timeline based on the second subset of code blocks being unencoded for transmission, encoding the second subset of code blocks for transmission based on the modified processing timeline, and transmitting the code block based on the re-transmission request and encoding the second subset of code blocks for transmission.

A non-transitory computer-readable medium storing code for wireless communications at a UE is described. The code may include instructions executable by a processor to cancel transmission of a TB including a set of code blocks, where a first subset of code blocks of the set of code blocks is encoded for transmission and a second subset of code blocks of the set of code blocks is unencoded for transmission based on the canceling, receive a re-transmission request for a code block of the second subset of code blocks including a set of parity check bits for the TB, modify a processing timeline based on the second subset of code blocks being unencoded for transmission, encode the second subset of code blocks for transmission based on the modified processing timeline, and transmit the code block based on the re-transmission request and encoding the second subset of code blocks for transmission.

In some examples of the method, apparatuses, and non-transitory computer-readable medium described herein, modifying the processing timeline may include operations, features, means, or instructions for modifying the processing timeline for transmitting the code block based on the re-transmission request.

Some examples of the method, apparatuses, and non-transitory computer-readable medium described herein may further include operations, features, means, or instructions for receiving a message including a grant for a second transmission, where the canceling may be based on the grant for the second transmission. In some examples of the method, apparatuses, and non-transitory computer-readable medium described herein, modifying the processing timeline may include operations, features, means, or instructions for modifying the processing timeline for the second transmission based on the second subset of code blocks being unencoded for transmission.

In some examples of the method, apparatuses, and non-transitory computer-readable medium described herein, modifying the processing timeline may include operations, features, means, or instructions for determining a timeline extension based on the second subset of code blocks being unencoded for transmission and adding the timeline extension to the processing timeline to determine the modified processing timeline. In some examples of the method, apparatuses, and non-transitory computer-readable medium described herein, the timeline extension may be a configured value. Some other examples of the method, apparatuses, and non-transitory computer-readable medium described herein may further include operations, features, means, or instructions for calculating the timeline extension based on a number of code blocks in the second subset of code blocks, a length of the TB, or a combination thereof.

Some examples of the method, apparatuses, and non-transitory computer-readable medium described herein may further include operations, features, means, or instructions for calculating the set of parity check bits for the TB based on encoding the second subset of code blocks for transmission.

A method for wireless communications at a base station is described. The method may include receiving, from a UE, a first subset of code blocks of a TB, where transmission of the TB is scheduled for a first set of resources, transmitting a message indicating a second set of resources overlapping in time with at least a portion of the first set of resources, determining that transmission of a second subset of code blocks of the TB by the UE is preempted based on the message, where the second subset of code blocks includes a code block with a set of parity check bits for the TB, and transmitting a re-transmission request message for the code block, where the re-transmission request message indicates a resource for transmission of the code block that is based on a processing timeline for the UE and the second subset of code blocks being preempted.

An apparatus for wireless communications at a base station is described. The apparatus may include a processor, memory in electronic communication with the processor, and instructions stored in the memory. The instructions may be executable by the processor to cause the apparatus to receive, from a UE, a first subset of code blocks of a TB, where transmission of the TB is scheduled for a first set of resources, transmit a message indicating a second set of resources overlapping in time with at least a portion of the first set of resources, determine that transmission of a second subset of code blocks of the TB by the UE is preempted based on the message, where the second subset of code blocks includes a code block with a set of parity check bits for the TB, and transmit a re-transmission request message for the code block, where the re-transmission request message indicates a resource for transmission of the code block that is based on a processing timeline for the UE and the second subset of code blocks being preempted.

Another apparatus for wireless communications at a base station is described. The apparatus may include means for receiving, from a UE, a first subset of code blocks of a TB, where transmission of the TB is scheduled for a first set of resources, transmitting a message indicating a second set of resources overlapping in time with at least a portion of the first set of resources, determining that transmission of a second subset of code blocks of the TB by the UE is preempted based on the message, where the second subset of code blocks includes a code block with a set of parity check bits for the TB, and transmitting a re-transmission request message for the code block, where the re-transmission request message indicates a resource for transmission of the code block that is based on a processing timeline for the UE and the second subset of code blocks being preempted.

A non-transitory computer-readable medium storing code for wireless communications at a base station is described. The code may include instructions executable by a processor to receive, from a UE, a first subset of code blocks of a TB, where transmission of the TB is scheduled for a first set of resources, transmit a message indicating a second set of resources overlapping in time with at least a portion of the first set of resources, determine that transmission of a second subset of code blocks of the TB by the UE is preempted based on the message, where the second subset of code blocks includes a code block with a set of parity check bits for the TB, and transmit a re-transmission request message for the code block, where the re-transmission request message indicates a resource for transmission of the code block that is based on a processing timeline for the UE and the second subset of code blocks being preempted.

Some examples of the method, apparatuses, and non-transitory computer-readable medium described herein may further include operations, features, means, or instructions for determining a timeline extension based on the second subset of code blocks being preempted and adding the timeline extension to the processing timeline for the UE to determine the resource for transmission of the code block. In some examples of the method, apparatuses, and non-transitory computer-readable medium described herein, the timeline extension may be a configured value. Some other examples of the method, apparatuses, and non-transitory computer-readable medium described herein may further include operations, features, means, or instructions for calculating the timeline extension based on a number of code blocks in the second subset of code blocks being preempted, a length of the TB, or a combination thereof.

A method for wireless communications at a UE is described. The method may include receiving a first grant of a first set of resources for a first uplink transmission, receiving a second grant of a second set of resources for a second uplink transmission, where the second set of resources for the second uplink transmission at least partially overlaps in time with the first set of resources for the first uplink transmission, canceling, based on receiving the second grant, transmission of a TB including a set of code blocks, where the TB is associated with the first uplink transmission, and where a first subset of code blocks of the set of code blocks is encoded for transmission and a second subset of code blocks of the set of code blocks is unencoded for transmission based on the canceling, receiving a third grant of a third set of resources for a third uplink transmission, identifying a non-overlap condition between the third set of resources and the first set of resources, and processing the third grant based on the identifying the non-overlap condition.

An apparatus for wireless communications at a UE is described. The apparatus may include a processor, memory coupled with the processor, and instructions stored in the memory. The instructions may be executable by the processor to cause the apparatus to receive a first grant of a first set of resources for a first uplink transmission, receive a second grant of a second set of resources for a second uplink transmission, where the second set of resources for the second uplink transmission at least partially overlaps in time with the first set of resources for the first uplink transmission, cancel, based on receiving the second grant, transmission of a TB including a set of code blocks, where the TB is associated with the first uplink transmission, and where a first subset of code blocks of the set of code blocks is encoded for transmission and a second subset of code blocks of the set of code blocks is unencoded for transmission based on the canceling, receive a third grant of a third set of resources for a third uplink transmission, identify a non-overlap condition between the third set of resources and the first set of resources, and process the third grant based on the identifying the non-overlap condition.

Another apparatus for wireless communications at a UE is described. The apparatus may include means for receiving a first grant of a first set of resources for a first uplink transmission, receiving a second grant of a second set of resources for a second uplink transmission, where the second set of resources for the second uplink transmission at least partially overlaps in time with the first set of resources for the first uplink transmission, canceling, based on receiving the second grant, transmission of a TB including a set of code blocks, where the TB is associated with the first uplink transmission, and where a first subset of code blocks of the set of code blocks is encoded for transmission and a second subset of code blocks of the set of code blocks is unencoded for transmission based on the canceling, receiving a third grant of a third set of resources for a third uplink transmission, identifying a non-overlap condition between the third set of resources and the first set of resources, and processing the third grant based on the identifying the non-overlap condition.

A non-transitory computer-readable medium storing code for wireless communications at a UE is described. The code may include instructions executable by a processor to receive a first grant of a first set of resources for a first uplink transmission, receive a second grant of a second set of resources for a second uplink transmission, where the second set of resources for the second uplink transmission at least partially overlaps in time with the first set of resources for the first uplink transmission, cancel, based on receiving the second grant, transmission of a TB including a set of code blocks, where the TB is associated with the first uplink transmission, and where a first subset of code blocks of the set of code blocks is encoded for transmission and a second subset of code blocks of the set of code blocks is unencoded for transmission based on the canceling, receive a third grant of a third set of resources for a third uplink transmission, identify a non-overlap condition between the third set of resources and the first set of resources, and process the third grant based on the identifying the non-overlap condition.

Some examples of the method, apparatuses, and non-transitory computer-readable medium described herein may further include operations, features, means, or instructions for determining that the third set of resources and the first set of resources at least partially overlap in time and identifying the third grant of the third set of resources as an error.

Some examples of the method, apparatuses, and non-transitory computer-readable medium described herein may further include operations, features, means, or instructions for determining that the third set of resources and the first set of resources at least partially overlap in time, encoding the TB for the first uplink transmission using a first processing block based on the first uplink transmission corresponding to a first priority, encoding an additional TB for the third uplink transmission using a second processing block based on the third uplink transmission corresponding to a second priority different from the first priority, and transmitting the third uplink transmission during time resources that at least partially overlap with the first set of resources.

In some examples of the method, apparatuses, and non-transitory computer-readable medium described herein, encoding the TB may be at least partially concurrent with encoding the additional TB.

Some examples of the method, apparatuses, and non-transitory computer-readable medium described herein may further include operations, features, means, or instructions for transmitting an indication of a number of component carriers (CCs) for supporting uplink transmissions of the first priority and transmitting an indication of a number of CCs for supporting uplink transmissions of the second priority.

A method for wireless communications at a base station is described. The method may include transmitting a first grant of a first set of resources for a first uplink transmission, transmitting a second grant of a second set of resources for a second uplink transmission, where the second set of resources for the second uplink transmission at least partially overlaps in time with the first set of resources for the first uplink transmission, scheduling a third set of resources for a third uplink transmission according to a non-overlap condition between the third set of resources and the first set of resources, and transmitting a third grant of the third set of resources for the third uplink transmission based on the scheduling.

An apparatus for wireless communications at a base station is described. The apparatus may include a processor, memory coupled with the processor, and instructions stored in the memory. The instructions may be executable by the processor to cause the apparatus to transmit a first grant of a first set of resources for a first uplink transmission, transmit a second grant of a second set of resources for a second uplink transmission, where the second set of resources for the second uplink transmission at least partially overlaps in time with the first set of resources for the first uplink transmission, schedule a third set of resources for a third uplink transmission according to a non-overlap condition between the third set of resources and the first set of resources, and transmit a third grant of the third set of resources for the third uplink transmission based on the scheduling.

Another apparatus for wireless communications at a base station is described. The apparatus may include means for transmitting a first grant of a first set of resources for a first uplink transmission, transmitting a second grant of a second set of resources for a second uplink transmission, where the second set of resources for the second uplink transmission at least partially overlaps in time with the first set of resources for the first uplink transmission, scheduling a third set of resources for a third uplink transmission according to a non-overlap condition between the third set of resources and the first set of resources, and transmitting a third grant of the third set of resources for the third uplink transmission based on the scheduling.

A non-transitory computer-readable medium storing code for wireless communications at a base station is described. The code may include instructions executable by a processor to transmit a first grant of a first set of resources for a first uplink transmission, transmit a second grant of a second set of resources for a second uplink transmission, where the second set of resources for the second uplink transmission at least partially overlaps in time with the first set of resources for the first uplink transmission, schedule a third set of resources for a third uplink transmission according to a non-overlap condition between the third set of resources and the first set of resources, and transmit a third grant of the third set of resources for the third uplink transmission based on the scheduling.

Some examples of the method, apparatuses, and non-transitory computer-readable medium described herein may further include operations, features, means, or instructions for receiving the third uplink transmission based on the third grant and the scheduling.

DETAILED DESCRIPTION

Figure 1:
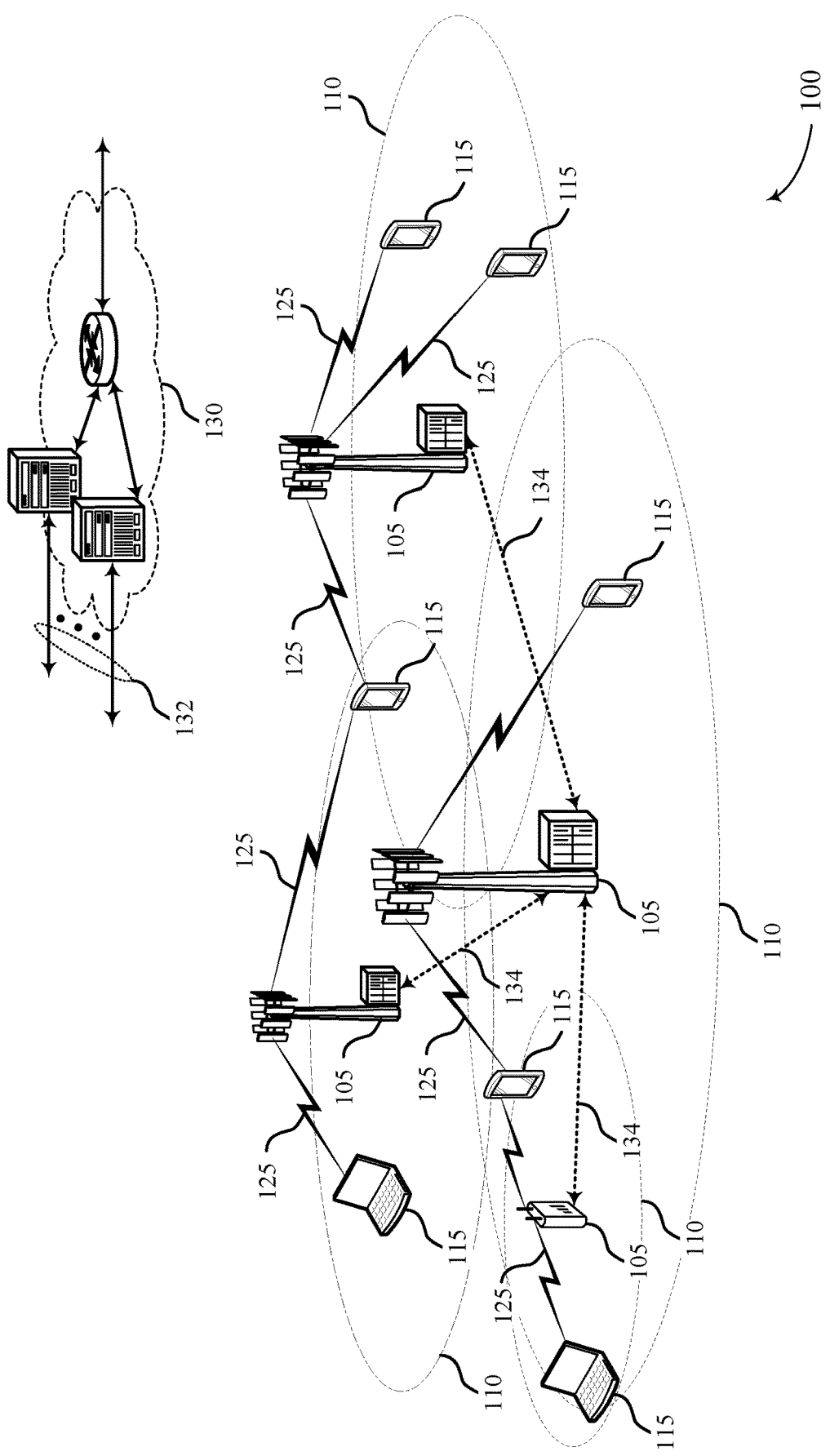
FIGS. 1 and 2 illustrate examples of wireless communications systems that support handling transport block (TB)-level parity check bits for interrupted transmissions in accordance with aspects of the present disclosure.

Some wireless communications systems may support uplink re-transmissions, where a base station may request a user equipment (UE) to re-transmit uplink information that the base station failed to receive or decode. In some cases, a system may support transport block (TB)-level re-transmissions, code block group (CBG)-level re-transmissions, code block-level re-transmissions, or some combination thereof. However, if operating using code block-based or CBG-based re-transmissions, transmission interruptions may stress processing timelines for UEs. For example, in some cases, a UE may be interrupted during processing (e.g., encoding) of a TB, and the UE may cancel transmission of the TB. For example, the UE may halt or suppress processing based on the interruption. Such a cancellation of transmission (e.g., suppression of processing) may result in an inaccurate current state for TB-level parity check bits (e.g., cyclic redundancy check (CRC) bits). That is, based on canceling transmission of the TB, a first subset of code blocks of the TB may be encoded for transmission, while a second subset of code blocks of the TB may be unencoded for transmission. The current state of the TB-level parity check bits may correspond to the first subset of encoded code blocks, but not the second subset of unencoded code blocks, resulting in an inaccurate set of parity check bits with respect to the entire TB.

If a base station requests the UE to re-transmit a code block including the TB-level parity check bits (or a CBG containing the code block that includes the TB-level parity check bits), the UE may process the second subset of unencoded code blocks in order to calculate the parity check bits for the entire TB. However, if the processing timeline for the re-transmission corresponds to a minimum processing timeline for the UE (e.g., a minimum processing timeline N2 for physical uplink shared channel (PUSCH) preparation, measured as a gap between the end of an uplink grant, such as a physical downlink control channel (PDCCH) message, and the first symbol of the corresponding PUSCH resources), the UE may not be able to process the second subset of unencoded code blocks within the allocated processing time. The UE, the base station, or both may implement one or more techniques to handle the TB-level parity check bits for interrupted transmissions.

In a first example, the UE may modify the code block including the TB-level parity check bits in order to reduce the processing time and meet the processing timeline (e.g., the minimum processing timeline for the UE). In some cases, the UE may set each bit of the TB-level parity check bits to a common bit value (e.g., "0"). In other cases, the UE may drop the TB-level parity check bits from the code block for transmission. In these other cases, the UE may perform rate-matching based on the number of bits (e.g., twenty-four bits) dropped from the code block.

In a second example, the base station may request re-transmission of at least all of the preempted code blocks (e.g., all unencoded code blocks) of the TB based on the interrupted initial transmission. By requesting re-transmission of all preempted code blocks, the UE may process and encode each code block of the second subset of unencoded code blocks based on the re-transmission request. Processing the second subset of code blocks allows the UE to update the state of the TB-level parity check bits to correspond to the entire TB (e.g., the CRC bits provide error checking for the second subset of code blocks in addition to the first subset of code blocks). By requesting re-transmission of each other code block (or CBG) prior to re-transmission of the code block (or CBG) including the TB-level parity check bits, the UE may process the code blocks and calculate the TB-level parity check bits in time to transmit the last code block (or CBG). In some cases, the base station may request re-transmission of the second subset of code blocks, all of the code blocks of the TB (e.g., in code block or CBG-level re-transmissions), or the entire TB (e.g., in a TB-level re-transmission).

In a third example, the base station, the UE, or both may extend a processing timeline for the re-transmission, such that the allotted processing time supports calculation of the TB-level parity check bits by the UE. For example, the minimum processing timeline may be extended by a number of symbols, d, to support processing of any unencoded code blocks and calculation of the TB-level parity check bits in time to transmit the code block including the TB-level parity check bits. The timeline extension value may be determined statically or dynamically. In some cases, the base station may determine the timeline extension and indicate a resource for re-transmission based on the timeline extension. In other cases, the UE may determine the timeline extension and transmit the re-transmission according to the timeline extension. Additionally or alternatively, if the interruption of the initial TB transmission is based on another uplink grant (e.g., an uplink grant for a higher priority uplink transmission), the base station may determine the timeline extension and indicate a resource for the higher priority uplink transmission based on the timeline extension. In other cases, the UE may determine the timeline extension and transmit the higher priority uplink transmission according to the timeline extension.

Aspects of the disclosure are initially described in the context of wireless communications systems. Additional aspects are described with reference to an encoding process, processing timelines, and process flows. Aspects of the disclosure are further illustrated by and described with reference to apparatus diagrams, system diagrams, and flowcharts that relate to handling TB-level parity check bits for interrupted transmissions.

FIG. 1 illustrates an example of a wireless communications system 100 that supports handling TB-level parity check bits for interrupted transmissions in accordance with aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, an LTE-A Pro network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation NodeB or giga-NodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples, half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1, N2, N3, or other interface). Base stations 105 may communicate with one another over backhaul links 134 (e.g., via an X2, Xn, or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that may be capable of tolerating interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a carrier aggregation configuration in conjunction with component carriers operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving device is equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g., synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples, a receiving device may use a single receive beam to receive along a single beam direction (e.g., when receiving a data signal). The single receive beam may be aligned in a beam direction determined based on listening according to different receive beam directions (e.g., a beam direction determined to have a highest signal strength, highest signal-to-noise ratio, or otherwise acceptable signal quality based on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use hybrid automatic repeat request (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30,720,000$ seconds. Time intervals of a communications resource may be organized according to radio frames each having a duration of 10 milliseconds (ms), where the frame period may be expressed as $T_f=307,200$ $T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases, a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an evolved universal mobile telecommunication system terrestrial radio access (E-UTRA) absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as orthogonal frequency division multiplexing (OFDM) or discrete Fourier transform spread OFDM (DFT-S-OFDM)).

The organizational structure of the carriers may be different for different radio access technologies (e.g., LTE, LTE-A, LTE-A Pro, NR). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or RBs) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and UEs 115 that support simultaneous communications via carriers associated with more than one different carrier bandwidth.

Wireless communications system 100 may support communication with a UE 115 on multiple cells or carriers, a feature which may be referred to as carrier aggregation or multi-carrier operation. A UE 115 may be configured with multiple downlink component carriers and one or more uplink component carriers according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other component carriers, which may include use of a reduced symbol duration as compared with symbol durations of the other component carriers. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may consist of one or multiple symbol periods. In some cases, the TTI duration (that is, the number of symbol periods in a TTI) may be variable.

Wireless communications system 100 may be an NR system that may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across the frequency domain) and horizontal (e.g., across the time domain) sharing of resources.

In some cases, wireless communications system 100 may support TB-level re-transmissions, CBG-level re-transmissions, code block-level re-transmissions, or some combination thereof. However, if operating using code block-based or CBG-based re-transmissions, transmission interruptions may stress processing timelines for UEs 115. For example, a UE 115 may be interrupted during processing (e.g., encoding) of a TB, and the UE 115 may cancel transmission of the TB based on the interruption. For example, the UE may halt or suppress processing. This suppression of processing (e.g., due to the cancellation) may result in an inaccurate current state for TB-level parity check bits (e.g., CRC bits). That is, based on canceling transmission of the TB (e.g., during an initial transmission of the TB), a first subset of code blocks of the TB may be encoded for transmission, while a second subset of code blocks of the TB may be unencoded for transmission. Accordingly, the current state of the TB-level parity check bits may correspond to the first subset of encoded code blocks, but not the second subset of unencoded code blocks, resulting in an inaccurate set of parity check bits with respect to the whole TB.

If a base station 105 requests the UE 115 to re-transmit a code block including the TB-level parity check bits (or a CBG containing the code block that includes the TB-level parity check bits), the UE 115 may process the second subset of unencoded code blocks in order to calculate the parity check bits for the entire TB. However, if the processing timeline for the re-transmission corresponds to a minimum processing timeline for the UE 115 (e.g., a minimum processing timeline, N2 for processing and encoding a single code block or CBG for transmission), the UE 115 may not be able to process the second subset of unencoded code blocks within the allocated processing time. The UE 115, the base station 105, or both may implement one or more techniques to handle the TB-level parity check bits for interrupted transmissions. In a first technique, the UE 115 may modify the code block (e.g., set the TB-level parity check bits to a common bit value or drop the TB-level parity check bits from the code block) to reduce processing time. In a second technique, the base station 105 may request re-transmission of all preempted code blocks (e.g., all unencoded code blocks, all code blocks of the TB, or the entire TB), supporting TB-level parity check calculation at the UE 115. In a third example, the base station 105 or UE 115 may extend a processing timeline for the re-transmission, such that the allotted processing time supports TB-level parity check calculation at the UE 115.

Figure 2:
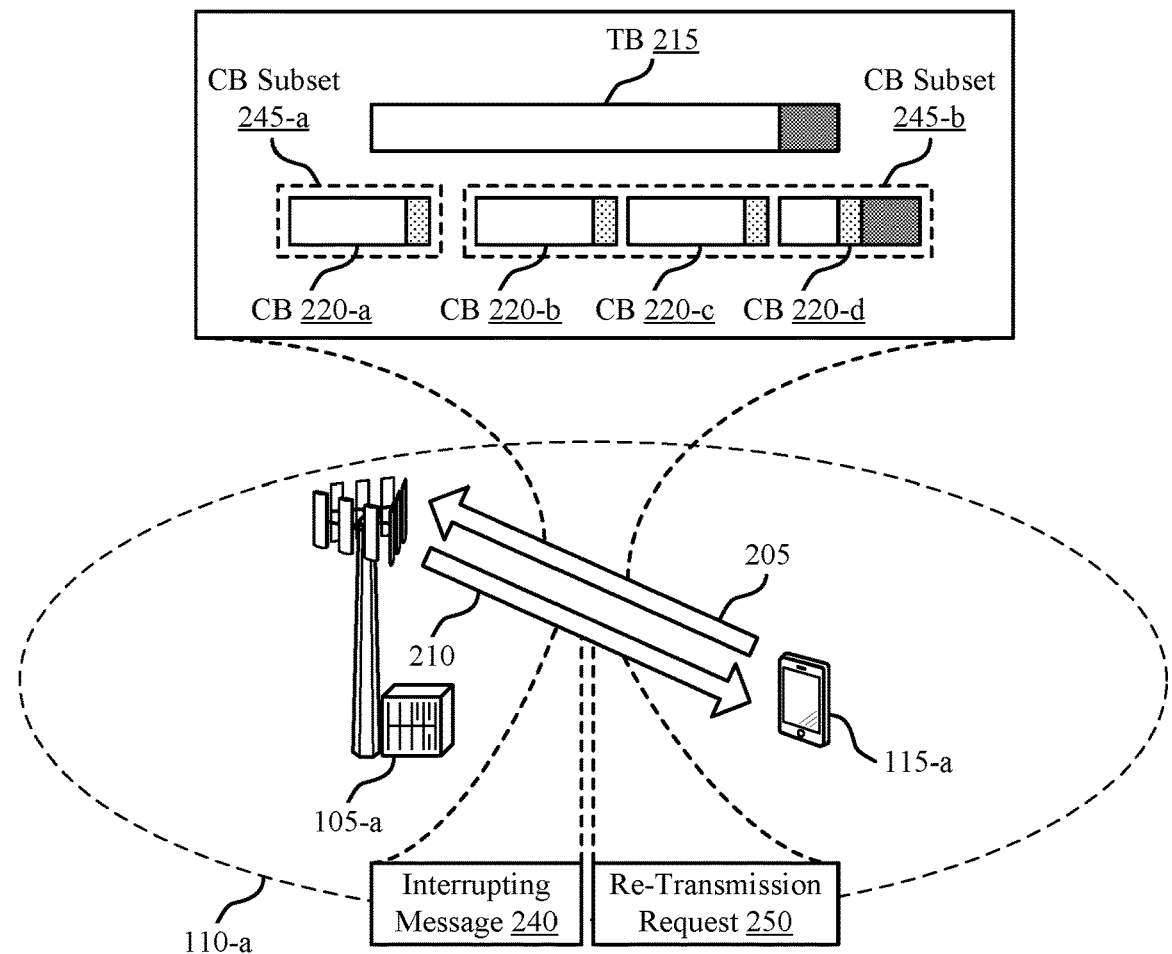

FIG. 2 illustrates an example of a wireless communications system 200 that supports handling TB-level parity check bits for interrupted transmissions in accordance with aspects of the present disclosure. The wireless communications system 200 may include a base station 105-*a* and a UE 115-*a*, which may be examples of the devices described with reference to FIG. 1. Base station 105-*a* may service a geographic coverage area 110-*a* as described with reference to FIG. 1. UE 115-*a* may transmit signals to base station 105-*a* on an uplink channel 205 (e.g., a physical uplink control channel (PUCCH), a PUSCH, etc.) and may receive signals from base station 105-*a* on a downlink channel 210 (e.g., a physical downlink control channel (PDCCH), a physical downlink shared channel (PDSCH), etc.). In some cases, the wireless communications system 200 may support re-transmissions on the uplink channel 205. UE 115-*a*, base station 105-*a*, or both may perform operations to handle re-transmission requests 250 where the requested information is not prepared for transmission.

In some wireless communications systems 200 (e.g., LTE systems, NR systems, or any other systems supporting uplink re-transmissions), multiple re-transmission modes may be supported for uplink transmissions. A first re-transmission mode may support TB-level re-transmission. In TB-level re-transmission, base station 105-*a* may request UE 115-*a* to re-transmit an entire TB 215 if reception or decoding of any portion of the TB 215 failed at base station 105-*a*. A second re-transmission mode may support CBG-level re-transmission, where a CBG may include a number of code blocks 220 (e.g., a pre-configured number of code blocks 220 or a dynamic number of code blocks 220). In CBG-level re-transmission, base station 105-*a* may request UE 115-*a* to re-transmit one or more CBGs in which at least the reception or decoding of one code block 220 (or a portion of a code block) failed at base station 105-*a*. In either of these re-transmission modes, base station 105-*a* may transmit a re-transmission request 250 to UE 115-*a* indicating the information to re-transmit (e.g., a TB 215, a CBG, a code block 220, etc.). The re-transmission request 250 may additionally indicate resources for the re-transmission, and UE 115-*a* may transmit the requested information in the indicated resources. In some cases, additional or alternative re-transmission modes may be supported for uplink transmissions. Base station 105-*a* may operate according to one re-transmission mode or may switch between re-transmission modes (e.g., based on channel conditions, devices in the system, etc.).

In some cases, base station 105-*a* may request re-transmission of an interrupted transmission. For example, UE 115-*a* may begin a transmission (e.g., an initial transmission) of a TB 215 on the uplink channel 205 (or, in some examples, on a sidelink channel to another UE 115). UE 115-*a* may determine a TB 215 for transmission, where the TB 215 is made up of multiple code blocks 220. These code blocks 220 may be grouped into CBGs of a common or varying size (e.g., two code blocks 220, three code blocks 220, etc.). The TB 215 may contain a payload 225 including the uplink information for transmission. In some cases, the payload 225 may additionally include redundant bits, frozen bits, or a combination thereof for improved decoding reliability at base station 105-*a*. This TB payload 225 may be encoded into code blocks 220 for transmission, where each code block 220 may include a portion of the payload 225. In some cases, each code block 220 may additionally include a code block CRC 230. A code block CRC 230 (or code block parity check bits) may be determined based on the payload 225 for that particular code block 220. Base station 105-a receiving the code block 220 may decode the payload 225 and the code block CRC 230 and may determine, based on a CRC operation, whether the payload 225 is decoded correctly based on the bits of the code block CRC 230. If a decoding operation at base station 105-a results in a code block payload 225 that is confirmed by the corresponding code block CRC 230, base station 105-a may determine that the code block 220 is decoded correctly. Otherwise, base station 105-a may determine that the decoding process for the code block 220 failed and may request a re-transmission of the code block 220.

In addition to code block CRCs 230, UE 115-a may include a TB CRC 235 in the uplink transmission. While code block CRCs 230 allow base station 105-a to determine whether each code block 220 is decoded successfully, the TB CRC 235 may support base station 105-a determining whether the entire TB 215 (e.g., the entire set of corresponding code blocks 220) is decoded successfully. As such, the TB CRC 235 may be based on the bits in each code block 220 of the TB 215. The TB CRC 235 may be included in a code block 220 of the TB 215, such as a last code block 220 of the TB 215 (e.g., code block n of a TB including n code blocks). If the CRC operation is a linear function, UE 115-a may calculate the TB CRC 235 sequentially. For example, UE 115-a may encode the code blocks 220 one-by-one, updating a state of the TB CRC 235 for each code block 220 prior to or during encoding. To support low latency operations, UE 115-a may also transmit code blocks 220 concurrent to encoding the TB 215 (e.g., concurrent to processing or encoding other code blocks 220 of the TB 215). In this way, a minimum processing timeline N2 of the UE 115-a may be achieved for long TBs 215 (e.g., TBs 215 spanning a number of symbols, sub-slots, slots, subframes, etc.), as UE 115-a may begin transmitting the TB 215 prior to completing encoding of the TB 215.

In one specific example, UE 115-a may organize TB 215 into code blocks 220-a, 220-b, 220-c, and 220-d. It is to be understood that TB 215 may correspond to any number of code blocks 220 or CBGs (e.g., based on the size of the TB 215, a coding rate for transmission, etc.). UE 115-a may process and encode the code blocks 220 in sequence. For example, UE 115-a may process code block 220-a, determining the code block CRC 230 for code block 220-a, updating the TB CRC 235 based on code block 220-a, and encoding code block 220-a for transmission. UE 115-a may transmit code block 220-a to base station 105-a concurrent to encoding one or more other code blocks 220 of TB 215 (e.g., code blocks 220-b, 220-c, 220-d, or some combination thereof). In this way, if UE 115-a is not interrupted during the transmission, UE 115-a may encode code blocks 220-a, 220-b, 220-c, and 220-d in sequence, and transmit code blocks 220-a, 220-b, 220-c, and 220-d to base station 105-a in sequence. Based on this process, base station 105-a may receive the TB 215 in code block segments, and the sequential processing may reduce the processing time needed for UE 115-a to begin transmission of the TB 215 (i.e., begin transmission of a first portion of the TB 215, code block 220).

However, in some cases, UE 115-a may be interrupted during transmission of a TB 215. For example, UE 115-a may receive an interrupting message 240 (e.g., from a base station 105-a) that interrupts an initial transmission of the TB 215. In some examples, UE 115-a may suspend processing (e.g., encoding) of the TB 215 due to the interrupting message 240.

In a first example, the interrupting message 240 may be an example of an uplink grant for UE 115-a. That is, UE 115-a may receive a first uplink grant to transmit the TB 215 (e.g., as a first PUSCH message), and then may receive a second uplink grant (i.e., the interrupting message 240) to transmit a different TB (e.g., as a second PUSCH message). The second uplink grant may be associated with a higher priority or lower latency than the first uplink grant, or both. For example, the second PUSCH may correspond to ultra-reliable low-latency communication (URLLC), while the first PUSCH may correspond to enhanced mobile broadband (eMBB) communication. The second uplink grant may preempt a number of symbols associated with the first uplink grant. For example, the first uplink grant may indicate a first set of resources for transmission of the first PUSCH message, and the second uplink grant may indicate a second set of resources for transmission of the second PUSCH message, where the second set of resources at least partially overlaps in time with the first set of resources. In this example, to handle the intra-UE multiplexing of uplink transmissions by UE 115-a, UE 115-a may suspend processing of the first PUSCH message (e.g., encoding and transmission of the first TB 215) in order to perform processing for the second PUSCH message according to the indicated second set of resources.

In a second example, the interrupting message 240 may be a request for UE 115-a to preempt the TB 215 transmission over a number of resources (e.g., using an uplink preemption indicator (ULPI)). The ULPI may indicate a set of time resources (e.g., a number of symbols) over which UE 115-a is to refrain from transmitting (e.g., to support inter-UE multiplexing of uplink transmissions). In some cases, UE 115-a may cancel the transmission and may not resume the transmission following the indicated set of resources. In these cases, UE 115-a may stop processing the TB 215 based on receiving the interrupting message 240 preempting the TB 215 transmission. In other cases, UE 115-a may resume the transmission following the indicates set of resources. In these other cases, UE 115-a may continue processing the TB 215 based on receiving the interrupting message 240 preempting the TB 215 transmission, or UE 115-a may temporarily halt the processing and then resume the processing of the TB 215 based on receiving the interrupting message 240 preempting the TB 215 transmission.

If UE 115-a stops processing the TB 215 based on the interrupting message 240, UE 115-a may not process or encode all of the code blocks 220 for the TB 215. Accordingly, UE 115-a may not complete calculating the TB CRC 235. For example, UE 115-a may process a first subset of code blocks 245-a and may update a current state of the TB CRC 235 based on the first subset of code blocks 245-a. If UE 115-a is interrupted and cancels transmission, a second subset of code blocks 245-b may be unencoded (e.g., not processed for transmission by UE 115-a). As such, following the incomplete encoding process, the TB CRC 235 may indicate the bits included in the first subset of code blocks 245-a but not the second subset of code blocks 245-b.

If base station 105-a transmits a re-transmission request 250 to UE 115-a for a code block 220 including the TB CRC 235 (e.g., a last code block 220-d or a last CBG), UE 115-a may process a number of code blocks 220 or CBGs to calculate the correct TB CRC 235 for transmission. This may significantly stress the processing capabilities of UE 115-a depending on the processing timeline for re-transmitting the code block 220-*d*. For example, if UE 115-*a* is scheduled to transmit the code block 220-*d* (or the CBG including code block 220-*d*) according to a minimum processing timeline N2 for UE 115-*a*, the minimum processing timeline may be based on an amount of time for UE 115-*a* to process and encode one code block 220 or CBG for transmission. However, to process and encode a code block 220 or CBG for transmission that includes a correct TB CRC 235 for the entire TB 215, UE 115-*a* may process and encode multiple code blocks 220 or CBGs in order to calculate the TB CRC 235.

To handle TB-level parity check bits (e.g., CRC bits) for interrupted transmissions, UE 115-*a*, base station 105-*a*, or both may implement one or more techniques. In a first example, if UE 115-*a* is configured for code block-based or CBG-based uplink re-transmissions and an initial TB 215 transmission is preempted, UE 115-*a* may modify a code block 220-*d* to meet a processing timeline. For example, UE 115-*a* may receive a re-transmission request 250 indicating at least code block 220-*d* including the TB CRC 235. UE 115-*a* may identify that the current state of the TB CRC 235 corresponds to the first subset of encoded code blocks 245-*a* (but not the second subset of unencoded code blocks 245-*b*) based on the interruption. Based on this current state not being accurate for the entire TB 215, UE 115-*a* may set the bits of the TB CRC 235 to common bit values (e.g., all zero bits, all one bits, etc.) for the re-transmission. Alternatively, UE 115-*a* may set the bits of the TB CRC 235 to common bit values if the initial TB 215 transmission is preempted (e.g., without checking the state of the TB CRC 235). UE 115-*a* may transmit the code block 220-*d* (e.g., within a last CBG) to base station 105-*a* with a TB CRC 235 where each TB CRC bit is set to the common bit value. In this way, UE 115-*a* may not process the other unencoded code blocks 220 of the TB 215 in order to transmit the requested code block 220-*d*, supporting transmission according to the processing timeline. In some cases, even if UE 115-*a* did not transmit the code block 220-*d* in the initial transmission of the TB 215 (e.g., based on the interruption), this transmission of the code block 220-*d* based on a re-transmission request 250 may be referred to as a "re-transmission."

In a second example, UE 115-*a* may modify the code block 220-*d* to meet the processing timeline by removing the TB CRC 235. For example, UE 115-*a* may identify that the current state of the TB CRC 235 corresponds to the first subset of encoded code blocks 245-*a* (but not the second subset of unencoded code blocks 245-*b*) based on the interruption. Based on this current state not being accurate for the entire TB 215, UE 115-*a* may drop the TB CRC 235 from the code block 220-*d* for the re-transmission. Alternatively, UE 115-*a* may drop the TB CRC 235 from the re-transmission of code block 220-*d* if the initial TB 215 transmission is preempted (e.g., without checking the state of the TB CRC 235). Dropping the TB CRC 235 may allow UE 115-*a* to refrain from processing the other unencoded code blocks 220 of the TB 215 and meet a processing timeline for the requested re-transmission. In some cases, to drop the TB CRC 235 from the code block 220-*d*, UE 115-*a* may modify a coding or rate-matching procedure, or both, for the code block 220-*d* to support encoding with a different number of bits.

In some cases, UE 115-*a* may be configured to transmit a portion of the interrupted TB 215 that is known to base station 105-*a*. For example, in a first aspect, UE 115-*a* may be configured to transmit in all symbols of the set of resources allocated of the TB 215 transmission until the start of the first preempted symbol. In this aspect, base station 105-*a* may monitor for and receive the portions of the TB 215 up to this first preempted symbol. In a second aspect, UE 115-*a* may determine when to suspend transmission of the TB 215 upon receiving the interrupting message 240. For example, based on processing capabilities of the UE 115-*a* and processing to be performed by UE 115-*a*, UE 115-*a* may determine (e.g., determine based on some algorithm or pre-configured value at UE 115-*a*) in which symbol to suspend transmission of the TB 215, where the first preempted symbol is the deadline for transmissions suspension.

Based on a configuration of UE 115-*a*, UE 115-*a* may transmit up to (but not including) a first code block 220 of the TB 215 that is at least partially scheduled for transmission within the preempted time resources. In a third example, for code block-based or CBG-based uplink re-transmission where the initial TB 215 transmission is interrupted, base station 105-*a* may request re-transmission of each code block 220 or CBG that is scheduled for transmission fully or partially within the preempted time resources (e.g., the preempted symbols). For example, code block 220-*b* may be a first sequential code block 220 of the TB 215 that is partially or fully preempted by the interrupting message 240. Based on a configuration, UE 115-*a* may transmit each code block up to (but not including) code block 220-*b* in sequence (e.g., UE 115-*a* may transmit code block 220-*a* to base station 105-*a*). Base station 105-*a* may determine to request a re-transmission from UE 115-*a*, and based on the configuration of UE 115-*a*, base station 105-*a* may request re-transmission of each code-block 220 fully or partially within the preempted symbols. For example, starting with code block 220-*b*, base station 105-*a* may request re-transmission of the remaining code blocks 220 of TB 215. In this way, based on the code blocks 220 or CBGs requested for re-transmission by base station 105-*a*, UE 115-*a* may process (e.g., encode) each code block 220 of the second subset of code blocks 245-*b* for transmission. Based on previously processing each code block 220 of the first subset of code blocks 245-*a*, UE 115-*a* may store a current state (e.g., a current value) for the TB CRC 235 calculated according to the first subset of code blocks 245-*a*. By processing each code block 220 of the second subset of code blocks 245-*b* based on the re-transmission request 250, UE 115-*a* may update the current state of the TB CRC 235 according to the second subset of code blocks 245-*b*, such that the TB CRC 235 is calculated according to all of the code blocks 220 in the TB 215. In this way, UE 115-*a* may prepare code block 220-*d* including the TB CRC 235 for transmission according to the processing timeline indicated by the re-transmission request 250 (e.g., if each other code-block 220 or CBG in the second subset of code blocks 245-*b* is requested to be re-transmitted prior to re-transmission of the code-block 220 or CBG that includes the TB CRC 235).

In a fourth example, base station 105-*a* may request re-transmission of all code blocks 220 or CBGs for the TB 215. For example, base station 105-*a* may be configured for code block-based or CBG-based retransmission. Base station 105-*a* may request re-transmission of each code block 220 or CBG of TB 215, such that UE 115-*a* re-transmits each other code block 220 or CBG of TB 215 prior to re-transmitting the code-block 220 or CBG that includes the TB CRC 235. The requested re-transmissions may not be scheduled contiguously. For example, base station 105-*a* may request re-transmission of code blocks 220-*a* and 220-*b* (e.g., a first CBG) in a first re-transmission request 250 and may request re-transmission of code blocks 220-*c* and 220-*d* (e.g., a second CBG including the TB CRC 235) in a second re-transmission request 250. UE 115-a may correspondingly transmit code blocks 220-a and 220-b in a first set of resources and code blocks 220-c and 220-d in a second set of resources subsequent to the first set of resources, where the first and second sets of resources may or may not be contiguous in time. In some cases, base station 105-a may request re-transmission of all of the code blocks 220 for TB 215 if UE 115-a determines when to suspend transmission of the TB 215. If base station 105-a cannot identify whether UE 115-a processed and transmitted code blocks 220 up to (but not including) the first code block 220 at least partially scheduled for transmission within the preempted symbols, base station 105-a may fallback to requesting re-transmission of each code block 220. Alternatively, base station 105-a may request re-transmission of each code block 220 of the TB 215 following a last code block 220 successfully received at base station 105-a (e.g., where successful reception is determined based on the code block CRC 230 of the last code block 220).

In a fifth example, if an initial TB 215 transmission is interrupted at UE 115-a, base station 105-a may implement TB-level re-transmission (e.g., rather than code block-level or CBG-level re-transmission). For example, base station 105-a may transmit a re-transmission request 250 for the TB 215, and UE 115-a may re-transmit the full TB 215. In this way, base station 105-a may ensure that UE 115-a can process (e.g., encode) all of the code blocks 220 for the TB 215, such that the TB CRC 235 is calculated for the entire TB 215. In some cases, base station 105-a may operate according to a CBG-based re-transmission operation mode, but may fall back to a TB-based re-transmission operation mode if the base station 105-a determines to request re-transmission of any portion of an interrupted initial TB 215 transmission.

In a sixth example, if preemption is configured on a given serving cell (e.g., the serving cell served by base station 105-a), uplink code block-based or CBG-based re-transmission may not be configured for the same serving cell. In this way, initial TB 215 transmissions may be interrupted in cells where TB-based re-transmissions are performed and may not be interrupted in cells where code block-based or CBG-based re-transmissions are performed. According to this example, for base station 105-a to transmit interrupting message 240, base station 105-a is configured in a TB-based re-transmission operation mode. If base station 105-a interrupts the initial TB 215 transmission, base station 105-a may ensure that UE 115-a can process (e.g., encode) all of the code blocks 220 for the TB 215, such that the TB CRC 235 is calculated for the entire TB 215.

In some cases, preemption may impact one or more component carriers (e.g., intra-band component carriers) in uplink carrier aggregation. For example, if a PUSCH transmission is preempted on a first component carrier, the same symbols may be preempted for PUSCH transmissions on other component carriers. In one example, if UE 115-a can continue the initial TB 215 transmission on a component carrier following a set of preempted symbols, UE 115-a may not send PUSCH information in the preempted symbols on the component carrier, and if there are PUSCH transmissions on other component carriers, the same symbols may be preempted for the other PUSCH transmissions. However, the PUSCH transmissions on any of the component carriers may be resumed following the preempted set of symbols. In another example, if UE 115-a may not continue the initial TB 215 transmission on a component carrier following the set of preempted symbols, UE 115-a may halt (e.g., cancel) PUSCH transmission at the start of the preempted symbols on the component carrier, and if there are PUSCH transmissions on other component carriers, the other PUSCH transmissions may be preempted and not continued starting with the same symbol. Furthermore, similar preemption rules to those described herein with respect to PUSCH transmissions on other component carriers may apply to PUSCH transmissions on other serving cells based on preemption on one cell.

In a seventh example, base station 105-a, UE 115-a, or both may modify a processing timeline to support code block-based or CBG-based re-transmission of an interrupted TB 215 transmission. For example, if base station 105-a requests re-transmission of the code block 220-d or the CBG including the TB CRC 235, a processing timeline for re-transmitting the code block 220-d or CBG may be extended by d time resources (e.g., symbols). In some cases, base station 105-a may indicate resources for re-transmission in the re-transmission request 250 that are based on extending the minimum processing timeline N2 for UE 115-a by a timeline extension d. This timeline extension may support UE 115-a processing at least the second subset of code blocks 245-b and determining the TB CRC 235 for all of the code blocks 220 of the TB 215 in time to transmit the code block 220-d or the CBG including the TB CRC 235 in the indicated resources. In other cases, base station 105-a and UE 115-a may identify the timeline extension d so that UE 115-a may process at least the second subset of code blocks 245-b in time to transmit the code block 220-d or the CBG including the TB CRC 235 in resources based on the identified timeline extension. Base station 105-a may monitor for the re-transmission based on the identified timeline extension.

In some examples, the length of the timeline extension, d, may be pre-configured at base station 105-a, UE 115-a, or both. In other examples, the length of the timeline extension, d, may be dynamically determined based on the number of code blocks in the second subset of code blocks 245-b, the length of the TB 215, the processing capabilities of the UE 115-a, or some combination of these or other variables related to the UE 115-a calculating the TB CRC 235. For example, the value of d may be subcarrier spacing dependent or based on the processing timeline capability of the UE 115-a (e.g., d may be different for UEs 115 capable of following PUSCH preparation timing capability #1 than for UEs 115 capable of following PUSCH preparation timing capability #2).

In some cases (e.g., if the initial TB 215 transmission is interrupted by replacing some portion of the PUSCH with another, more urgent PUSCH), base station 105-a, UE 115-a, or both may modify a processing timeline for the more urgent PUSCH. Similar to above, UE 115-a may transmit the more urgent PUSCH (e.g., a second TB corresponding to a URLLC transmission) according to a processing timeline that includes a minimum processing timeline for the more urgent PUSCH and a timeline extension, d (which may be pre-configured or calculated as described herein). During the timeline extension, UE 115-a may complete processing—and, in some cases, transmission—of the code blocks 220 for the TB 215. In this way, the current state of the TB CRC 235 may be calculated for the entire TB 215, even if the initial TB 215 transmission is preempted.

It is to be understood that the wireless communications system 200 may implement any combination of the examples described herein. For example, UE 115-a, base station 105-a, or both may perform any combination of the above operations to support handling TB-level parity check bits for interrupted transmissions.

Figure 3:
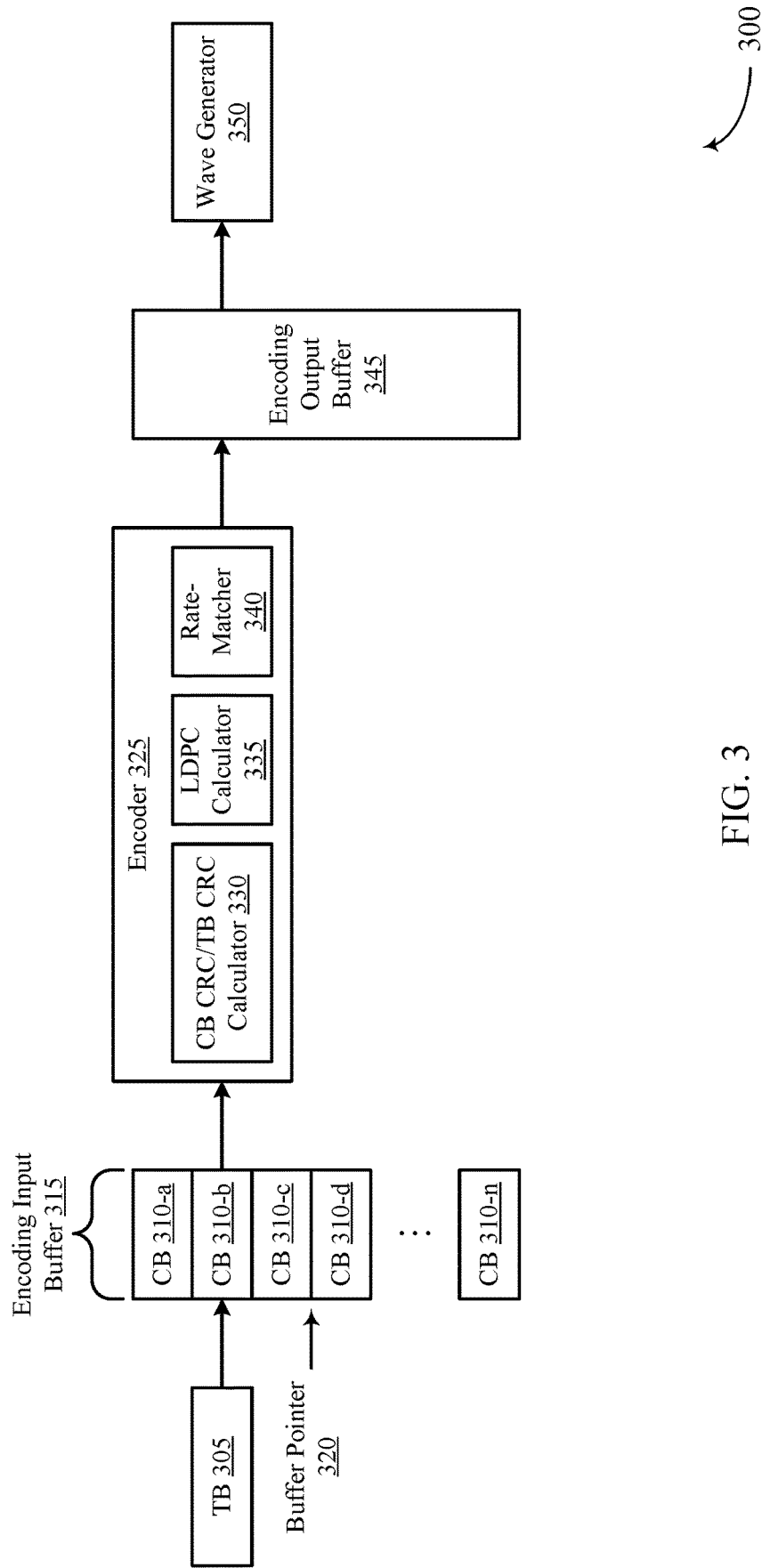
FIG. 3 illustrates an example of an encoding process that supports handling TB-level parity check bits for interrupted transmissions in accordance with aspects of the present disclosure.

FIG. 3 illustrates an example of an encoding process 300 that supports handling TB-level parity check bits for interrupted transmissions in accordance with aspects of the present disclosure. The encoding process 300 may be performed by a UE, such as a UE 115 described with reference to FIGS. 1 and 2. The encoding process 300 may support sequential processing of code blocks 310 of a TB 305, allowing for concurrent transmission and processing of code blocks 310 within a TB 305. Based on the encoding process 300, an initial TB 305 transmission may be interrupted mid-processing, as described with reference to FIG. 2.

In the encoding process 300, the TB 305 may be split into code blocks 310, where the code blocks 310 may be buffered in (i.e., loaded into) an encoding input buffer 315. These code blocks 310 may be passed one-by-one into a code block CRC/TB CRC calculator 330 (e.g., within an encoder 325). Here, the encoder 325 may calculate a code block CRC for the code block 310 and may attach the code block CRC to the code block 310. Additionally, the encoder 325 may update the state of the TB CRC (i.e., the TB CRC code) based on the code block 310, the code block CRC, or both. As the CRC operation may be an example of a linear function with respect to the exclusive or (XOR) function (i.e., CRC(A xor B)=CRC(A) xor CRC(B)), the TB CRC may be calculated sequentially using one code block 310 at a time (e.g., as opposed to calculating the TB CRC in one-shot). This may improve transmission latency, as the UE 115 may process and transmit portions of the TB 305 prior to or concurrent with processing other portions of the TB 305.

In some cases, following the code block CRC/TB CRC calculator 330, the code block 310 may pass to the low-density parity-check (LDPC) calculator 335, which may calculate and attach an LDPC code to the code block 310. Additionally or alternatively, the code block 310 may be sent to a rate-matcher 340, which may perform rate-matching on the code block 310 to determine the code block 310 for transmission (e.g., according to a specific codeword size). Following rate-matching, the code block 310 may be loaded into an encoding output buffer 345. A wave generator 350 (e.g., and an antenna) may retrieve the encoded code block 310 from the encoding output buffer 345 and transmit the encoded code block 310 according to a scheduler (e.g., where the code block 310 is transmitted in resources scheduled for the TB 305 transmission). In some examples, the code blocks 310 are transmitted in groups (e.g., CBGs). Based on the sequential nature of the encoding process 300, one or more code blocks 310 may be transmitted concurrent to processing of other code blocks 310 or prior to processing of other code blocks 310. For example, the UE 115 may transmit a first code block 310-a concurrent to processing code blocks 310-b and 310-c, and prior to processing other code blocks 310-d through 310-n. A buffer pointer 320 may track the processing within the encoding input buffer 315.

If processing of the TB 305 is interrupted, and a base station 105 receiving the TB 305 fails to decode one or more code blocks 310 or CBGs, the base station 105 may request the UE 115 to re-transmit the one or more code blocks 310 or CBGs. If the last code block 310-n or the last CBG containing the last code block 310-n is requested, and the last code block 310-n will include the TB CRC, the UE 115 may have the TB CRC ready for re-transmission of this code block 310-n. The UE 115, the base station 105, or both may perform any combination of the techniques described with reference to FIG. 2 to support re-transmission of the code block 310-n containing the TB CRC.

Figures 4A, 4B, 4C:
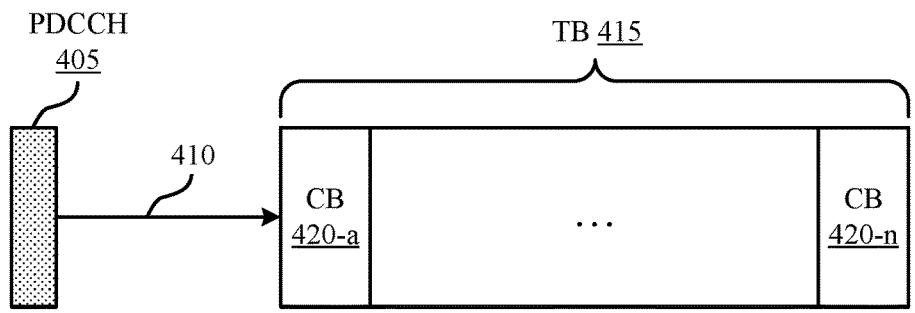
FIGS. 4A, 4B, and 4C illustrate examples of processing timelines that support handling TB-level parity check bits for interrupted transmissions in accordance with aspects of the present disclosure.

FIGS. 4A, 4B, and 4C illustrate examples of processing timelines 400 that support handling TB-level parity check bits for interrupted transmissions in accordance with aspects of the present disclosure. FIG. 4A illustrates an example of a processing timeline 400-a for a TB 415 (e.g., an initial transmission). For example, a UE (e.g., a UE 115 as described with reference to FIGS. 1 through 3) may receive a PDCCH transmission 405 granting resources for an uplink transmission of the TB 415. The PDCCH transmission 405 may indicate the resources that are based on a minimum processing timeline 410 for the UE 115 or may indicate the minimum processing timeline 410 itself. In some cases, the minimum processing timeline 410 may be based on a processing time for the UE 115 to prepare one code block 420 or one CBG for transmission, as opposed to a processing time for the UE 115 to prepare the full TB 415 for transmission. For example, based on the encoding process (e.g., the encoding process 300 described with reference to FIG. 3), the UE 115 may process and encode code block 420-a for transmission according to the processing timeline 410 prior to processing and encoding code block 420-n (e.g., a last code block 420 of the TB 415 containing a set of parity check bits for the TB 415) for transmission. However, due to the length of the TB 415 and the encoding process, the code block 420-n may be ready in time for transmission of the code block 420-n with the correctly calculated set of parity check bits for the TB 415 (e.g., TB CRC bits).

FIG. 4B illustrates an example of a processing timeline 400-b for a code block-based or CBG-based re-transmission. As the minimum processing timeline 410 may be based on a processing time for the UE 115 to prepare one code block 420 or one CBG for transmission, the same minimum processing timeline 410 may be used for initial transmissions and re-transmissions. So, if a base station (e.g., a base station 105 as described with reference to FIGS. 1 through 3) requests re-transmission of an unprocessed (e.g., unencoded) code block 420, the minimum processing timeline 410 may support the UE 115 processing and encoding the requested code block 420 in time to transmit the requested code block 420 in the indicated resources. However, if processing and encoding the requested code block 420 involves processing and encoding additional code blocks 420, this minimum processing timeline 410 may not allow enough time for the UE 115 to prepare the code block 420 for transmission. For example, if the base station 105 requests re-transmission of code block 420-n containing the set of parity check bits for the TB 415, and the UE 115 has multiple unencoded code blocks 420 that the current state of the set of parity check bits for the TB 415 is not yet based on, the UE 115 may implement one or more techniques to follow the minimum processing timeline 410 and complete encoding of the code block 420-n in time for transmission. For example, in some examples, the UE 115 may set each bit of the set of parity check bits for the TB 415 to a common bit value or may drop the set of parity check bits for the TB 415 from code block 420-n entirely, allowing the UE 115 to refrain from processing the other unencoded code blocks 420 of the TB 415.

FIG. 4C illustrates an example of a processing timeline 400-c for a code block-based or CBG-based re-transmission with a timeline extension 425. As discussed above with reference to FIG. 4B, if a base station 105 requests re-transmission of code block 420-n containing a set of parity check bits for the TB 415, and the UE 115 has one or more other unencoded code blocks 420 that are not reflected in the current state of the set of parity check bits for the TB 415, the UE 115 may not be able to meet the minimum processing timeline 410 for the code block 420-*n* due to the calculations for the set of parity check bits for the TB 415. In some cases, to support calculating the set of parity check bits for the TB 415, the code block 420-*n* may be re-transmitted in resources based on a modified processing timeline. For example, a first time resource for transmitting the code block 420-*n* may be determined by adding a timeline extension 425 to the minimum processing timeline 410 for the UE 115. The timeline extension 425 may be a configured value or may be calculated based on a number of code blocks 420 that were preempted or unencoded, a number of code blocks 420 in the TB 415, a processing capability of the UE 115, or some combination thereof. In some cases, the base station 105 may determine the modified processing timeline and may indicate a corresponding resource for re-transmission of the code block 420-*n* in the PDCCH transmission 405 (i.e., the re-transmission request). In other cases, the UE 115 may determine the modified processing timeline and may re-transmit the code block 420-*n* in a resource corresponding to the modified processing timeline. In these other cases, the base station 105 may additionally determine the modified processing timeline and receive the re-transmission in the resource corresponding to the modified processing timeline.

Figure 5:
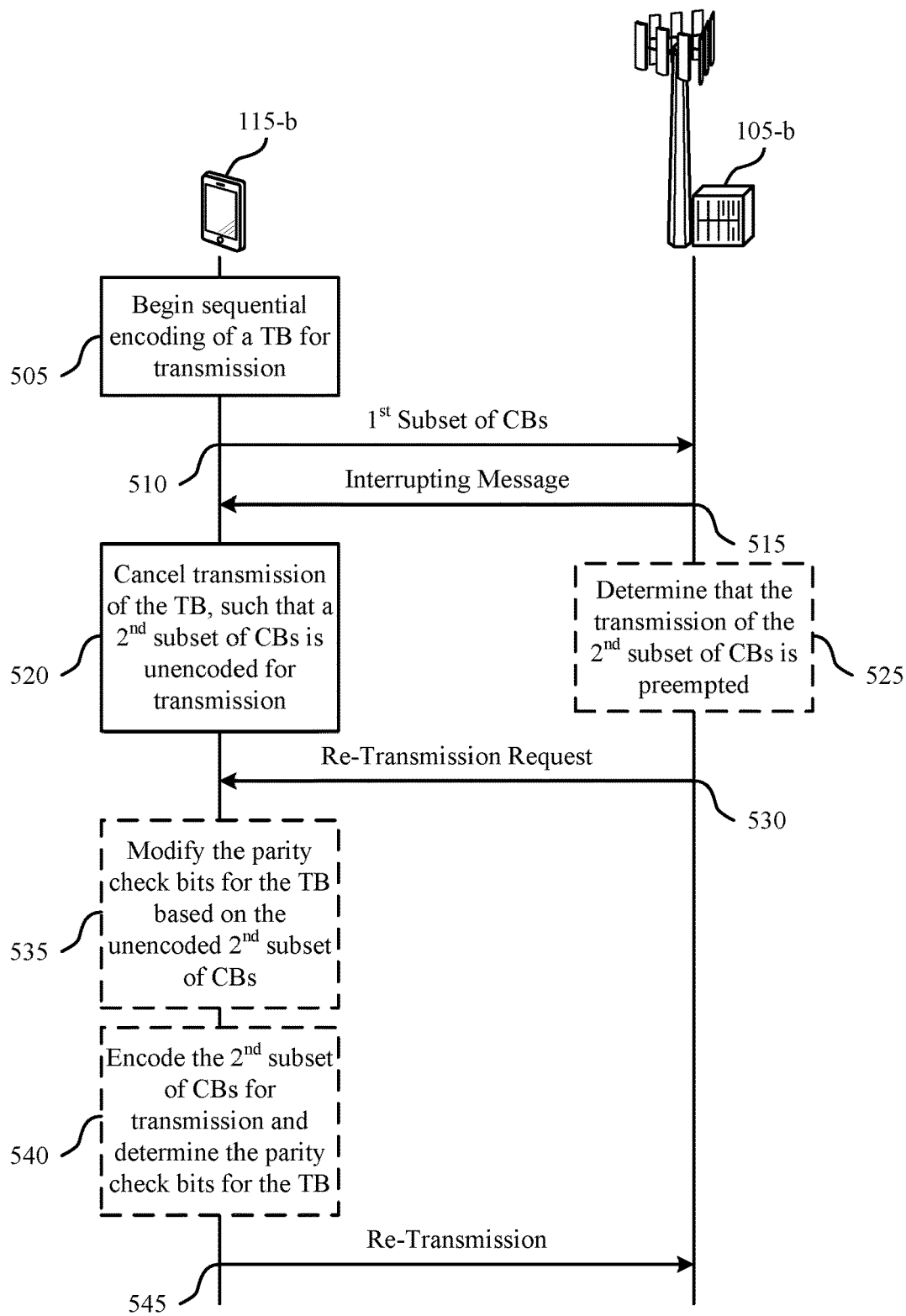
FIGS. 5 through 7 illustrate examples of process flows that support handling TB-level parity check bits for interrupted transmissions in accordance with aspects of the present disclosure.

FIG. 5 illustrates an example of a process flow 500 that supports handling TB-level parity check bits for interrupted transmissions in accordance with aspects of the present disclosure. The process flow 500 may illustrate example operations supporting re-transmission of a code block including TB parity check bits. For example, UE 115-*b* may be interrupted during processing (e.g., encoding) of a TB for transmission, and base station 105-*b* may request UE 115-*b* to re-transmit at least a portion of the TB. UE 115-*b* and base station 105-*b* may be examples of the corresponding wireless devices described with reference to FIGS. 1 through 4. Alternative examples of the following may be implemented, where some steps are performed in a different order than described or are not performed at all. In some cases, steps may include additional features not mentioned below, or further steps may be added.

At 505, UE 115-*b* may begin sequential encoding of a TB for transmission, where the TB includes a set of code blocks. UE 115-*b* may process and encode for transmission a first subset of code blocks of the TB. This processing may involve iteratively updating a current state of a set of parity check bits (e.g., CRC bits) for the TB based on each code block. In some cases, at 510, UE 115-*b* may transmit the first subset of code blocks to base station 105-*b*.

At 515, UE 115-*b* may receive an interrupting message. In some cases, UE 115-*b* may receive the interrupting message from base station 105-*b*. In a first example, the interrupting message may indicate a grant for a transmission with a higher priority than the TB in resources previously reserved for the TB transmission. In a second example, the interrupting message may command UE 115-*b* to refrain from transmitting in a portion of the resources previously reserved for the TB transmission. At 520, UE 115-*b* may cancel the transmission (e.g., halt the encoding, suppress the processing, or both) of the TB based on the interrupting message. The transmission may be canceled, for example, during an initial transmission such that the first subset of code blocks is encoded but a second subset of code blocks of the TB is unencoded for transmission. Accordingly, the set of parity check bits for the TB may not be based on the second subset of code blocks. In some cases, at 525, base station 105-*b* may determine that the transmission of the second subset of code blocks is preempted.

At 530, base station 105-*b* may transmit a re-transmission request to UE 115-*b*. In some cases, the message may request re-transmission of a code block of the second subset of code blocks that includes the set of parity check bits for the TB. At 535, UE 115-*b* may modify the code block that includes the set of parity check bits for transmission based on the interrupted initial TB transmission. For example, in some cases, UE 115-*b* may determine that a current state of the set of parity check bits for the TB corresponds to the first subset of code blocks (e.g., but not the second subset of code blocks) based on the canceled transmission process. Based on this determination, UE 115-*b* may modify the code block. In some examples, UE 115-*b* may set each bit of the set of parity check bits for the TB to a common bit value (e.g., "0"). In other examples, UE 115-*b* may remove the set of parity check bits for the TB from the code block.

In other cases, the message may request re-transmission of at least the second subset of code blocks. For example, the re-transmission request may request re-transmission of the second subset of code blocks, all of the code blocks of the TB, or the TB. At 540, UE 115-*b* may process (e.g., encode) the requested code blocks (or TB) for transmission. Based on this process, UE 115-*b* may update the state of the parity check bits for the TB such that the parity check bits are based on the second subset of code blocks in addition to the first subset of code blocks (i.e., all of the code blocks of the TB).

At 545, UE 115-*b* may re-transmit the requested information (e.g., the requested code block(s), CBG(s), TB(s), or some combination thereof) based on handling the TB-level parity check bits for the interrupted transmission.

Figure 6:
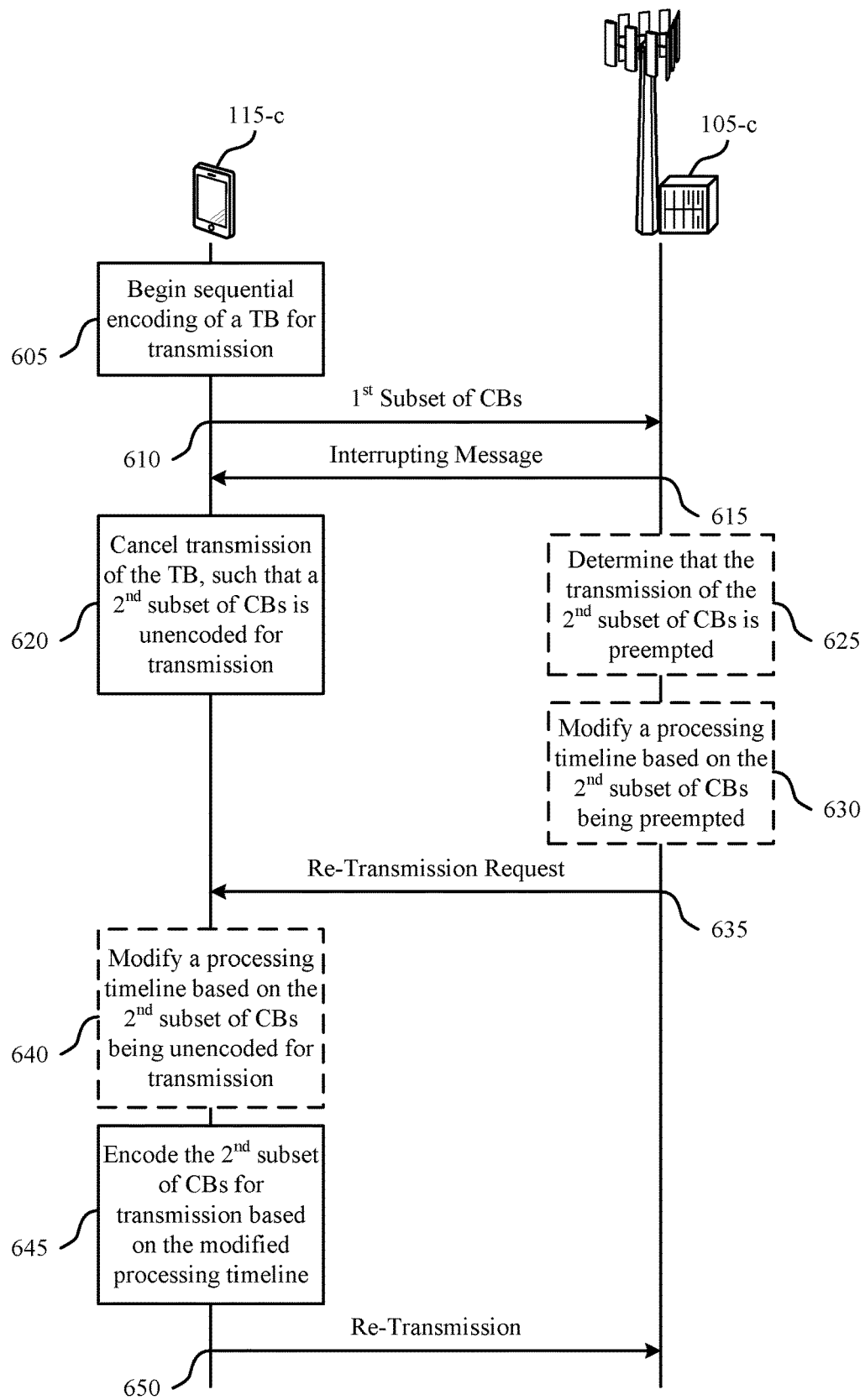

FIG. 6 illustrates an example of a process flow 600 that supports handling TB-level parity check bits for interrupted transmissions in accordance with aspects of the present disclosure. The process flow 600 may illustrate example operations supporting re-transmission of a code block including TB parity check bits. For example, UE 115-*c* may be interrupted during processing (e.g., encoding) of a TB for transmission, and base station 105-*c* may request UE 115-*c* to re-transmit at least a portion of the TB. UE 115-*c* and base station 105-*c* may be examples of the corresponding wireless devices described with reference to FIGS. 1 through 4. Alternative examples of the following may be implemented, where some steps are performed in a different order than described or are not performed at all. In some cases, steps may include additional features not mentioned below, or further steps may be added. Furthermore, UE 115-*c*, base station 105-*c*, or both may additionally or alternatively perform operations described with respect to FIG. 5.

At 605, UE 115-*c* may begin sequential encoding of a TB for transmission, where the TB includes a set of code blocks. UE 115-*c* may process and encode for transmission a first subset of code blocks of the TB. This processing may involve iteratively updating a current state of a set of parity check bits (e.g., CRC bits) for the TB based on each code block. In some cases, at 610, UE 115-*c* may transmit the first subset of code blocks to base station 105-*c*.

At 615, UE 115-*c* may receive an interrupting message. In some cases, UE 115-*c* may receive the interrupting message from base station 105-*c*. At 620, UE 115-*c* may cancel the transmission (e.g., halt the encoding, suppress the processing, or both) of the TB based on the interrupting message. The transmission may be canceled, for example, during an initial transmission of the TB such that the first subset of code blocks is encoded but a second subset of code blocks of the TB is unencoded for transmission (e.g., the remaining code blocks of the TB other than the first subset of code blocks). Accordingly, the set of parity check bits for the TB may not be based on the second subset of code blocks. In some cases, at 625, base station 105-*c* may determine that the transmission of the second subset of code blocks is preempted.

Base station 105-*c* or UE 115-*c* may modify a processing timeline for a re-transmission request based on the interrupted initial transmission. In some cases, at 630, base station 105-*c* may generate a re-transmission request message, where the re-transmission request message indicates a resource for transmission of a code block (e.g., a code block including the set of parity check bits for the TB) that is based on a processing timeline for the UE and the second subset of code blocks being preempted. At 635, base station 105-*c* may transmit the re-transmission request message to UE 115-*c*.

In some cases, at 640, UE 115-*c* may modify a processing timeline based on the second subset of code blocks being unencoded for transmission. In other cases, UE 115-*c* may use the resource indicated in the re-transmission request, where the resource was determined using the modified processing timeline. At 645, UE 115-*c* may process (e.g., encode) the second subset of code blocks based on the modified processing timeline. For example, due to a timeline extension, UE 115-*c* may have time to calculate the set of parity check bits for the TB further based on the second subset of code blocks, such that the set of parity check bits for the TB indicates the correct values for all of the code blocks of the TB. At 650, UE 115-*c* may transmit the code block including the calculated set of parity check bits for the TB based on the re-transmission request message.

Figure 7:
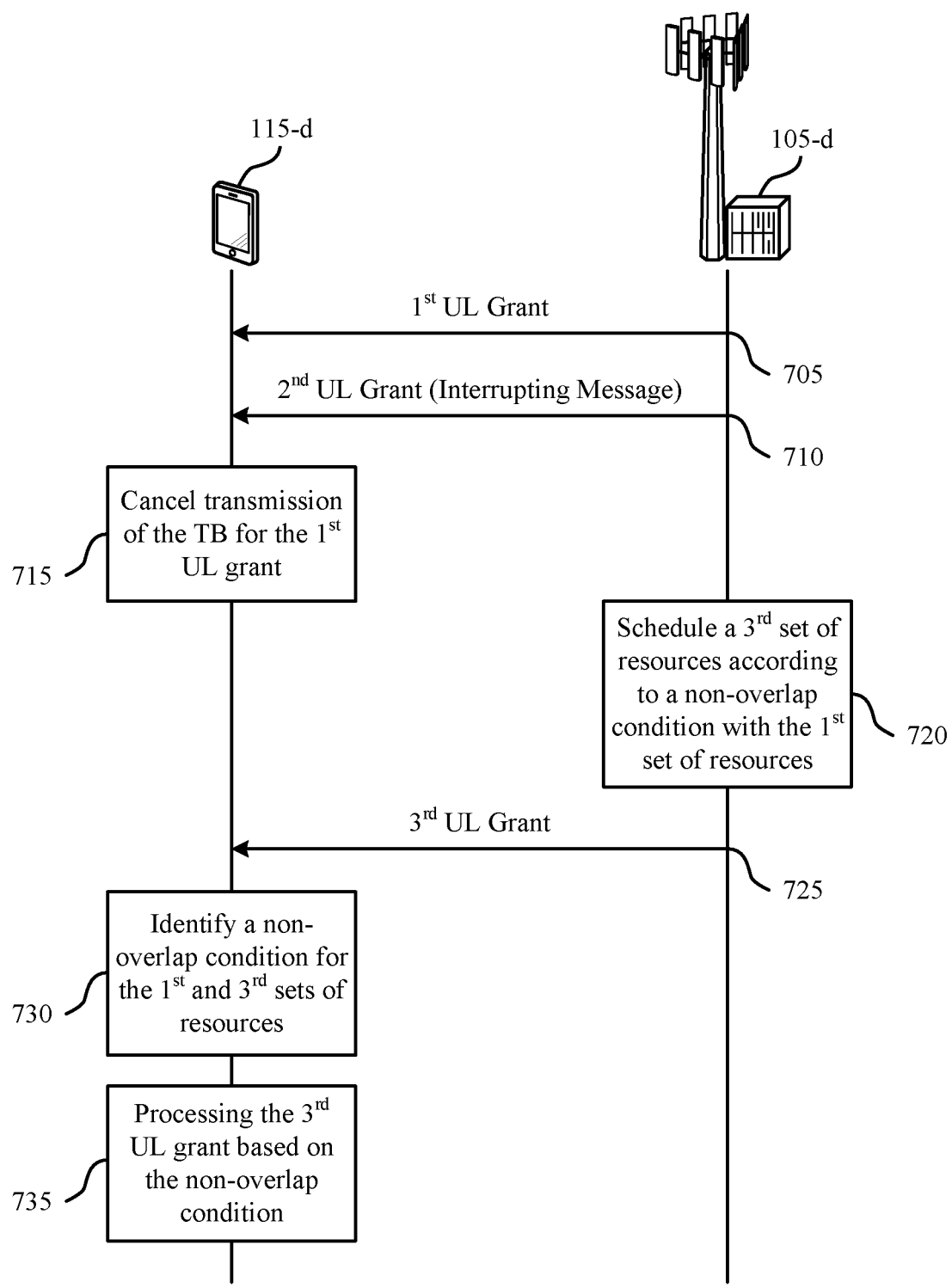

FIG. 7 illustrates an example of a process flow 700 that supports handling TB-level parity check bits for interrupted transmissions in accordance with aspects of the present disclosure. The process flow 700 may illustrate example operations supporting scheduling uplink transmissions such that the uplink transmissions do not overlap in time with preempted resources for another uplink grant. For example, UE 115-*d* may be interrupted during processing (e.g., encoding) of a TB for a first PUSCH transmission, and base station 105-*d* may schedule an additional uplink grant for a second PUSCH transmission for symbols distinct from the preempted symbols of the first PUSCH transmission. UE 115-*d* and base station 105-*d* may be examples of the corresponding wireless devices described with reference to FIGS. 1 through 4. Alternative examples of the following may be implemented, where some steps are performed in a different order than described or are not performed at all. In some cases, steps may include additional features not mentioned below, or further steps may be added. Furthermore, UE 115-*d*, base station 105-*d*, or both may additionally or alternatively perform operations described with respect to FIGS. 5 and 6.

At 705, base station 105-*d* may transmit and UE 115-*d* may receive a first grant of a first set of resources for a first uplink transmission. At 710, base station 105-*d* may transmit and UE 115-*d* may receive a second grant of a second set of resources for a second uplink transmission, where the second set of resources for the second uplink transmission at least partially overlaps in time with the first set of resources for the first uplink transmission. In some cases, the second grant may be referred to as an interrupting message, as this grant may schedule a transmission (i.e., the second uplink transmission) preempting the first uplink transmission. At 715, UE 115-*d* may cancel transmission of a TB associated with the first uplink transmission based on receiving the second grant. For example, due to canceling the transmission, a first subset of code blocks of the TB is encoded for transmission and a second subset of code blocks of the TB is unencoded for transmission.

At 720, base station 105-*d* may schedule a third set of resources for a third uplink transmission according to a non-overlap condition between the third set of resources and the first set of resources (e.g., the preempted resources of the first set of resources). The non-overlap condition may be priority level-specific or may be for any transmissions. Based on the non-overlap condition, base station 105-*d* may schedule the third set of resources in symbols non-overlapping with any preempted symbols of the first set of resources (e.g., symbols preempted due to the scheduled second uplink transmission). In some cases, the third uplink transmission may be a re-transmission of the first uplink transmission (or a portion of the first uplink transmission).

At 725, base station 105-*d* may transmit and UE 115-*d* may receive a third grant of the third set of resources for the third uplink transmission (e.g., based on the scheduling at base station 105-*d*). At 730, UE 115-*d* may identify a non-overlap condition between the third set of resources and the first set of resources. For example, the non-overlap condition implemented at UE 115-*d* may be the same non-overlap condition implemented at base station 105-*d*. For example, UE 115-*d* may determine whether the third set of resources partially overlaps in time with the first set of resources (e.g., the preempted resources of the first set of resources). At 735, UE 115-*d* may process the third grant based on identifying the non-overlap condition.

In a first example, if the third set of resources and the first set of resources at least partially overlap in time, UE 115-*d* may identify the third grant as an error. In a second example (e.g., if the non-overlap condition is priority-specific), if the third set of resources and the first set of resources at least partially overlap in time, but the third uplink transmission and the first uplink transmission correspond to different priorities, UE 115-*d* may encode the TB for the first uplink transmission using a first processing block based on the first uplink transmission corresponding to a first priority and encode (e.g., concurrent to encoding the TB) an additional TB for the third uplink transmission using a second processing block based on the third uplink transmission corresponding to a second priority different from (e.g., higher than) the first priority. UE 115-*d* may transmit and base station 105-*d* may receive the third uplink transmission during time resources that at least partially overlap with the first set of resources (e.g., based on the parallel processing at UE 115-*d*). In some cases, UE 115-*d* may transmit indications of numbers of component carriers (CCs) that support each priority level (e.g., the first priority and the second priority). In a third example (e.g., if the non-overlap condition is priority-specific), if the third set of resources and the first set of resources at least partially overlap in time and the third uplink transmission and the first uplink transmission correspond to a same priority, UE 115-*d* may identify the third grant as an error.

In some specific implementations, UE 115-*d* may receive a first downlink control information (DCI) message (i.e., a first grant at 705) scheduling a first PUSCH transmission to base station 105-*d*. If the first PUSCH transmission is interrupted at UE 115-*d* (e.g., by a second grant at 710), UE 115-*d* may not receive another DCI message scheduling another PUSCH transmission (e.g., corresponding to the same or a different HARQ process) on any of the preempted symbols. For example, UE 115-*d* may determine an uplink grant for the first PUSCH transmission, where the UE 115-*d* is granted a set of symbols (e.g., a slot, such as symbols 0 to 13) to transmit the first PUSCH transmission. If this first PUSCH transmission is preempted following a particular symbol (e.g., symbol 2), the UE 115-*d* may not receive a request (e.g., a third grant at 725) on the same carrier to transmit another PUSCH transmission on the remaining subset of symbols (e.g., the preempted symbols 3 to 13). For example, base station 105-*d* may identify the preempted symbols at UE 115-*d* for the first PUSCH transmission and may schedule additional PUSCH transmissions in non-preempted symbols (e.g., symbols subsequent to the preempted symbols). If UE 115-*d* receives a DCI message with an uplink grant scheduling a PUSCH transmission in at least one preempted symbol, the UE 115-*d* may determine an error for this uplink grant and may ignore the uplink grant (e.g., refrain from processing the uplink grant, refrain from encoding the corresponding PUSCH message, refrain from transmitting the corresponding PUSCH message, etc.).

In some cases, UE 115-*d* may manage transmissions corresponding to different priorities or priority levels. For example, UE 115-*d* may manage high priority transmissions and low priority transmissions (e.g., relative to the high priority transmissions). In some examples, UE 115-*d* may use a carrier aggregation (CA) framework—or a framework similar to the CA framework—to indicate a UE capability to handle different priority PUSCH messages. For example, UE 115-*d* may indicate to base station 105-*d* a number of CCs supporting low priority PUSCH and a number of CCs supporting high priority PUSCH on a per band basis for a band combination. According to such a UE capability, UE 115-*d* may support processing different priority channels separately. For example, UE 115-*d* may be capable of processing a low priority PUSCH channel separately from a high priority PUSCH channel. The priority of a PUSCH transmission may be indicated at the physical (PHY) layer based on a bit or bit field in the DCI, a radio network temporary identifier (RNTI), a particular DCI format or size, a particular control resource set (CORESET) or search space set, or a combination thereof. Additionally or alternatively, the priority of the PUSCH transmission may be indicated at the MAC layer as an outcome of logical channel (LCH) prioritization.

If a first PUSCH transmission is interrupted at UE 115-*d* (e.g., UE 115-*d* cancels or halts encoding and transmission of the first PUSCH transmission at 715 based on a second PUSCH transmission or some other interrupting signal), UE 115-*d* may not receive another DCI message scheduling another PUSCH transmission (e.g., corresponding to the same or a different HARQ process) on any of the preempted symbols if the first PUSCH transmission and the other PUSCH transmission have the same priority. For example, if a low priority PUSCH transmission is preempted at UE 115-*d* (e.g., based on a high priority PUSCH transmission), UE 115-*d* may not be scheduled with a second low priority PUSCH transmission in the preempted symbols of the first low priority PUSCH transmission. However, if the low priority PUSCH is preempted, and UE 115-*d* receives a grant for transmitting a high priority PUSCH in the preempted symbols, UE 115-*d* may perform the processing and transmission of the high priority PUSCH based on UE 115-*d* using different processing blocks for processing different priority channels. For example, UE 115-*d* may work on processing a high priority PUSCH (e.g., encoding the TB for the high priority PUSCH) while continuing to process the low priority PUSCH (e.g., the preempted PUSCH). This concurrent processing may allow for a priority-based non-overlap condition to be upheld at UE 115-*d*, base station 105-*d*, or both. In this way, UE 115-*d* may obtain CRC bits for the TB of the low priority PUSCH (e.g., without a significant delay) as long as another low priority PUSCH is not requested by base station 105-*d* overlapping with the same, original, low priority PUSCH resources. Base station 105-*d* may perform uplink grant scheduling (e.g., at 720) to meet the non-overlap condition at UE 115-*d* (e.g., based on PUSCH priorities or independent of PUSCH priorities).

Figure 8:
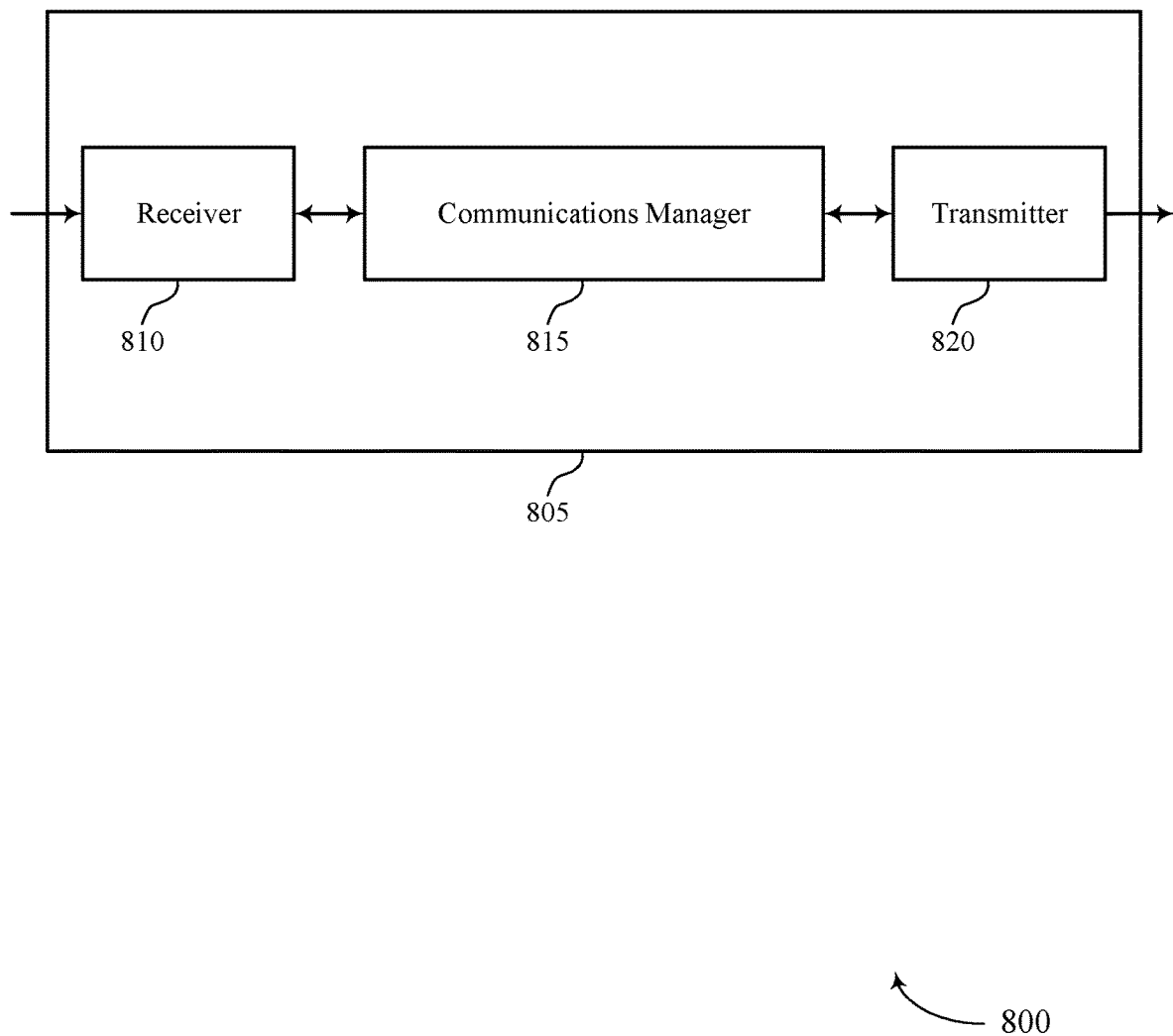
FIGS. 8 and 9 show block diagrams of devices that support handling TB-level parity check bits for interrupted transmissions in accordance with aspects of the present disclosure.

FIG. 8 shows a block diagram 800 of a device 805 that supports handling TB-level parity check bits for interrupted transmissions in accordance with aspects of the present disclosure. The device 805 may be an example of aspects of a UE 115 as described herein. The device 805 may include a receiver 810, a communications manager 815, and a transmitter 820. The device 805 may also include a processor. Each of these components may be in communication with one another (e.g., via one or more buses).

The receiver 810 may receive information such as packets, user data, or control information associated with various information channels (e.g., control channels, data channels, and information related to handling TB-level parity check bits for interrupted transmissions, etc.). Information may be passed on to other components of the device 805. The receiver 810 may be an example of aspects of the transceiver 1120 described with reference to FIG. 11. The receiver 810 may utilize a single antenna or a set of antennas.

In one implementation, the communications manager 815 may cancel transmission of a TB including a set of code blocks, where a first subset of code blocks of the set of code blocks is encoded for transmission and a second subset of code blocks of the set of code blocks is unencoded for transmission based on the canceling, receive a re-transmission request for a code block of the second subset of code blocks including a set of parity check bits for the TB, determine that a current state of the set of parity check bits for the TB corresponds to the first subset of code blocks (e.g., but not the second subset of code blocks) based on the canceling, modify the code block including the set of parity check bits for the TB based on the determining, and transmit the modified code block based on the re-transmission request. This implementation may be used to reduce processing latency at the UE 115, as the UE 115 may refrain from processing one or more code blocks at an encoder. Additionally, this implementation may reduce computational complexity at the UE 115, as the UE 115 may refrain from calculating the set of parity check bits for the TB.

Furthermore, based on modifying the code block including the set of parity check bits for the TB, a processor of the UE 115 (e.g., controlling the receiver 810, the communication manager 815, and/or the transmitter 820) may reduce the processing resources needed to prepare the code block for re-transmission. In some cases, an encoder may reduce a number of code blocks to process, reducing the power needed at the encoder to prepare the code block for re-transmission.

Additionally or alternatively, in another implementation, the communications manager 815 may cancel transmission of a TB including a set of code blocks, where a first subset of code blocks of the set of code blocks is encoded for transmission and a second subset of code blocks of the set of code blocks is unencoded for transmission based on the canceling, encode the second subset of code blocks for transmission based on the modified processing timeline, receive a re-transmission request for a code block of the second subset of code blocks including a set of parity check bits for the TB, modify a processing timeline based on the second subset of code blocks being unencoded for transmission, and transmit the code block based on the re-transmission request and encoding the second subset of code blocks for transmission. This implementation may be used to improve reliability of transmissions by the UE 115, as the UE 115 may process information in time to transmit within an allocated resource. This may reduce signaling overhead in the system, as the number of re-transmissions by the UE 115 may be reduced.

Furthermore, based on modifying the processing timeline, a processor of the UE 115 (e.g., controlling the receiver 810, the communication manager 815, and/or the transmitter 820) may efficiently use processing resources to prepare the code block for re-transmission. For example, the modified processing timeline may reduce the instantaneous processing overhead at the processor, spreading the processing operations over a longer time period.

The communications manager 815 may be an example of aspects of the communications manager 1110 described herein. The communications manager 815, or its sub-components, may be implemented in hardware, code (e.g., software or firmware) executed by a processor, or any combination thereof. If implemented in code executed by a processor, the functions of the communications manager 815, or its sub-components may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure.

The communications manager 815, or its sub-components, may be physically located at various positions, including being distributed such that portions of functions are implemented at different physical locations by one or more physical components. In some examples, the communications manager 815, or its sub-components, may be a separate and distinct component in accordance with various aspects of the present disclosure. In some examples, the communications manager 815, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 820 may transmit signals generated by other components of the device 805. In some examples, the transmitter 820 may be collocated with a receiver 810 in a transceiver module. For example, the transmitter 820 may be an example of aspects of the transceiver 1120 described with reference to FIG. 11. The transmitter 820 may utilize a single antenna or a set of antennas.

Figure 9:
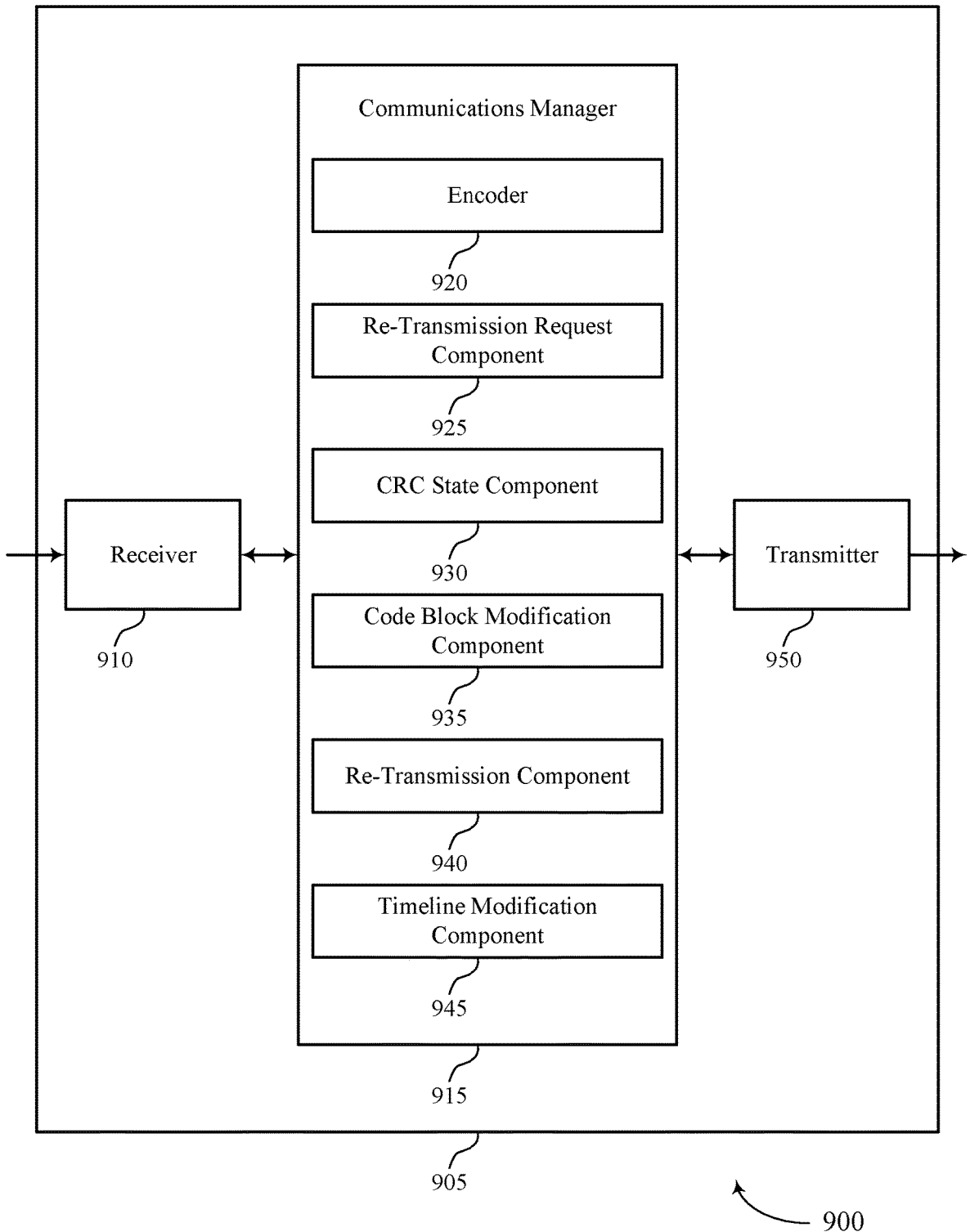

FIG. 9 shows a block diagram 900 of a device 905 that supports handling TB-level parity check bits for interrupted transmissions in accordance with aspects of the present disclosure. The device 905 may be an example of aspects of a device 805, or a UE 115 as described herein. The device 905 may include a receiver 910, a communications manager 915, and a transmitter 950. The device 905 may also include a processor. Each of these components may be in communication with one another (e.g., via one or more buses).

The receiver 910 may receive information such as packets, user data, or control information associated with various information channels (e.g., control channels, data channels, and information related to handling TB-level parity check bits for interrupted transmissions, etc.). Information may be passed on to other components of the device 905. The receiver 910 may be an example of aspects of the transceiver 1120 described with reference to FIG. 11. The receiver 910 may utilize a single antenna or a set of antennas.

The communications manager 915 may be an example of aspects of the communications manager 815 as described herein. The communications manager 915 may include an encoder 920, a re-transmission request component 925, a CRC state component 930, a code block modification component 935, a re-transmission component 940, and a timeline modification component 945. The communications manager 915 may be an example of aspects of the communications manager 1110 described herein.

In some cases, the encoder 920 may cancel transmission of a TB including a set of code blocks, where a first subset of code blocks of the set of code blocks is encoded for transmission and a second subset of code blocks of the set of code blocks is unencoded for transmission based on the canceling. The re-transmission request component 925 may receive a re-transmission request for a code block of the second subset of code blocks including a set of parity check bits for the TB. The CRC state component 930 may determine that a current state of the set of parity check bits for the TB corresponds to the first subset of code blocks based on the canceling. The code block modification component 935 may modify the code block including the set of parity check bits for the TB based on the determining. The re-transmission component 940 may transmit the modified code block based on the re-transmission request.

In some other cases, the encoder 920 may cancel transmission of a TB including a set of code blocks, where a first subset of code blocks of the set of code blocks is encoded for transmission and a second subset of code blocks of the set of code blocks is unencoded for transmission based on the canceling. The re-transmission request component 925 may receive a re-transmission request for a code block of the second subset of code blocks including a set of parity check bits for the TB. The timeline modification component 945 may modify a processing timeline based on the second subset of code blocks being unencoded for transmission. The encoder 920 may encode the second subset of code blocks for transmission based on the modified processing timeline. The re-transmission component 940 may transmit the code block based on the re-transmission request and encoding the second subset of code blocks for transmission.

The transmitter 950 may transmit signals generated by other components of the device 905. In some examples, the transmitter 950 may be collocated with a receiver 910 in a transceiver module. For example, the transmitter 950 may be an example of aspects of the transceiver 1120 described with reference to FIG. 11. The transmitter 950 may utilize a single antenna or a set of antennas.

Figure 10:
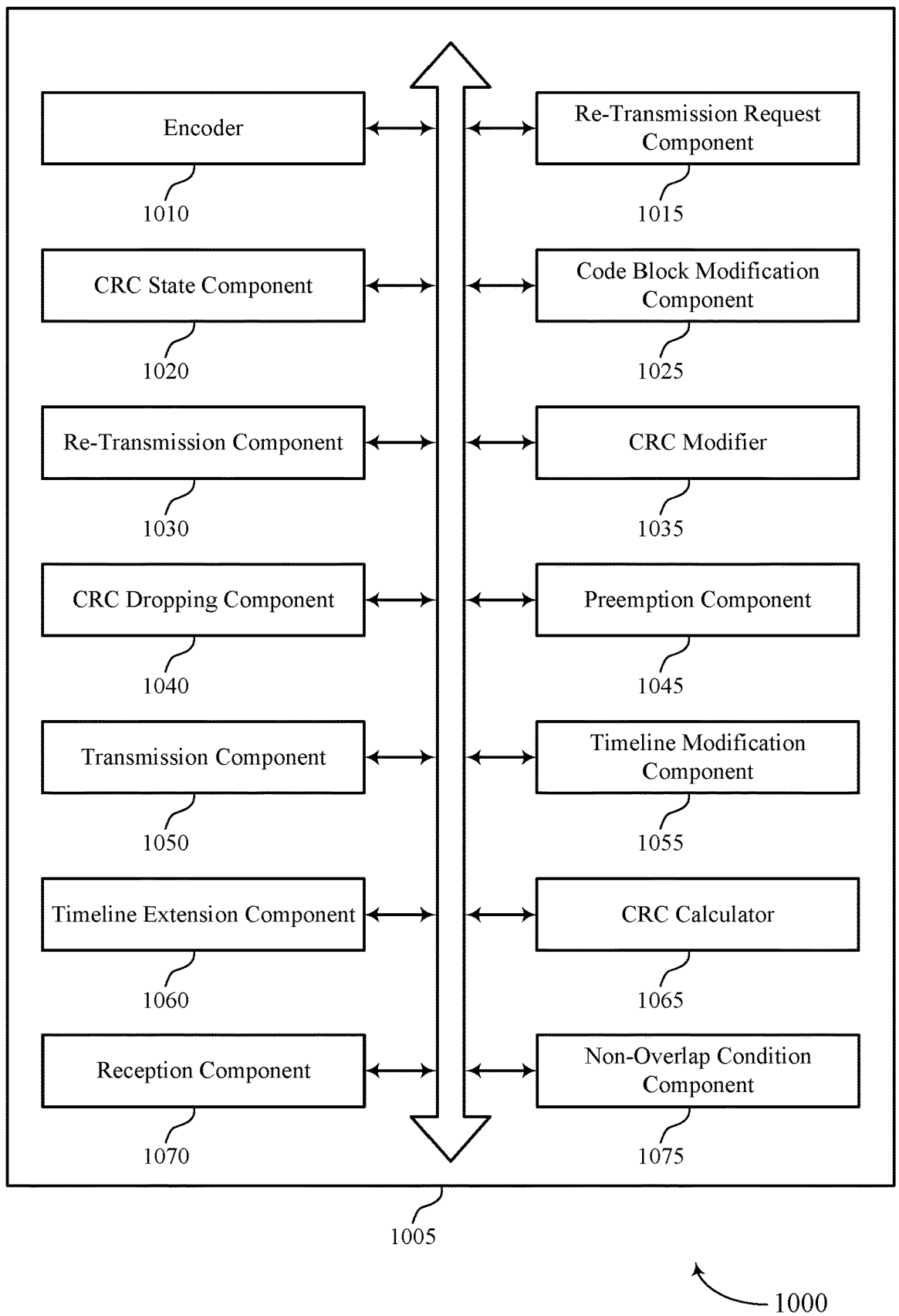
FIG. 10 shows a block diagram of a communications manager that supports handling TB-level parity check bits for interrupted transmissions in accordance with aspects of the present disclosure.

FIG. 10 shows a block diagram 1000 of a communications manager 1005 that supports handling TB-level parity check bits for interrupted transmissions in accordance with aspects of the present disclosure. The communications manager 1005 may be an example of aspects of a communications manager 815, a communications manager 915, or a communications manager 1110 described herein. The communications manager 1005 may include an encoder 1010, a re-transmission request component 1015, a CRC state component 1020, a code block modification component 1025, a re-transmission component 1030, a CRC modifier 1035, a CRC dropping component 1040, a preemption component 1045, a transmission component 1050, a timeline modification component 1055, a timeline extension component 1060, a CRC calculator 1065, a reception component 1070, a non-overlap condition component 1075, or a combination thereof. Each of these modules may communicate, directly or indirectly, with one another (e.g., via one or more buses).

In a first implementation, the encoder 1010 may cancel transmission of a TB including a set of code blocks, where a first subset of code blocks of the set of code blocks is encoded for transmission and a second subset of code blocks of the set of code blocks is unencoded for transmission based on the canceling.

The re-transmission request component 1015 may receive a re-transmission request for a code block of the second subset of code blocks including a set of parity check bits for the TB. The CRC state component 1020 may determine that a current state of the set of parity check bits for the TB corresponds to the first subset of code blocks based on the canceling. In some cases, the set of parity check bits is a set of CRC bits.

The code block modification component 1025 may modify the code block including the set of parity check bits for the TB based on the determining. In some examples, the modifying may involve the CRC modifier 1035 setting each bit of the set of parity check bits for the TB to a common bit value based on the determining. In some cases, the common bit value is a zero bit value or a one bit value. In some other examples, the modifying involves the CRC dropping component 1040 removing the set of parity check bits for the TB from the code block based on the determining. The modifying may involve the CRC dropping component 1040 rate-matching the code block based on removing the set of parity check bits for the TB from the code block.

The re-transmission component 1030 may transmit the modified code block based on the re-transmission request.

The preemption component 1045 may receive a message preempting transmission of the TB, where the canceling is based on receiving the message. In some cases, the transmission of the TB is based on a first grant and the message preempting transmission of the TB includes a second grant for a second transmission overlapping at least one time resource of the first grant. In some other cases, the transmission of the TB is based on a first grant and the message preempting transmission of the TB requests the UE to refrain from transmitting in at least one time resource of the first grant.

The transmission component 1050 may transmit, for the TB, the first subset of code blocks based on the first subset of code blocks being encoded for transmission. In some cases, the transmission of the first subset of code blocks is part of an initial transmission of the TB by the UE.

In a second implementation, the encoder 1010 may cancel transmission of a TB including a set of code blocks, where a first subset of code blocks of the set of code blocks is encoded for transmission and a second subset of code blocks of the set of code blocks is unencoded for transmission based on the canceling. The re-transmission request component 1015 may receive a re-transmission request for a code block of the second subset of code blocks including a set of parity check bits for the TB.

The timeline modification component 1055 may modify a processing timeline based on the second subset of code blocks being unencoded for transmission. In some examples, modifying the processing timeline may involve the timeline modification component 1055 modifying the processing timeline for transmitting the code block based on the re-transmission request. Modifying the processing timeline may involve the timeline extension component 1060 determining a timeline extension based on the second subset of code blocks being unencoded for transmission and adding the timeline extension to the processing timeline to determine the modified processing timeline. In some cases, the timeline extension is a configured value. In some other cases, the timeline extension component 1060 may calculate the timeline extension based on a number of code blocks in the second subset of code blocks, a length of the TB, or a combination thereof.

The encoder 1010 may encode the second subset of code blocks for transmission based on the modified processing timeline. The re-transmission component 1030 may transmit the code block based on the re-transmission request and encoding the second subset of code blocks for transmission.

In some cases, the preemption component 1045 may receive a message including a grant for a second transmission, where the canceling is based on the grant for the second transmission. In some of these cases, modifying the processing timeline involves the preemption component 1045 modifying the processing timeline for the second transmission based on the second subset of code blocks being unencoded for transmission.

The CRC calculator 1065 may calculate the set of parity check bits for the TB based on encoding the second subset of code blocks for transmission.

In a third implementation, the reception component 1070 may receive a first grant of a first set of resources for a first uplink transmission and receive a second grant of a second set of resources for a second uplink transmission, where the second set of resources for the second uplink transmission at least partially overlaps in time with the first set of resources for the first uplink transmission. The encoder 1010 may cancel transmission of a TB including a set of code blocks based on receiving the second grant, where the TB is associated with the first uplink transmission, and where a first subset of code blocks of the set of code blocks is encoded for transmission and a second subset of code blocks of the set of code blocks is unencoded for transmission based on the canceling.

The reception component 1070 may receive a third grant of a third set of resources for a third uplink transmission. The non-overlap condition component 1075 may identify a non-overlap condition between the third set of resources and the first set of resources and may process the third grant based on the identifying the non-overlap condition.

In some cases, the non-overlap condition component 1075 may determine that the third set of resources and the first set of resources at least partially overlap in time and may identify the third grant of the third set of resources as an error.

In some cases, the non-overlap condition component 1075 may determine that the third set of resources and the first set of resources at least partially overlap in time. The encoder 1010 may encode the TB for the first uplink transmission using a first processing block based on the first uplink transmission corresponding to a first priority and may encode an additional TB for the third uplink transmission using a second processing block based on the third uplink transmission corresponding to a second priority different from the first priority. In some examples, encoding the TB is at least partially concurrent with encoding the additional TB. The transmission component 1050 may transmit the third uplink transmission during time resources that at least partially overlap with the first set of resources. In some cases, the transmission component 1050 may transmit an indication of a number of CCs for supporting uplink transmissions of the first priority and may transmit an indication of a number of CCs for supporting uplink transmissions of the second priority.

Figure 11:
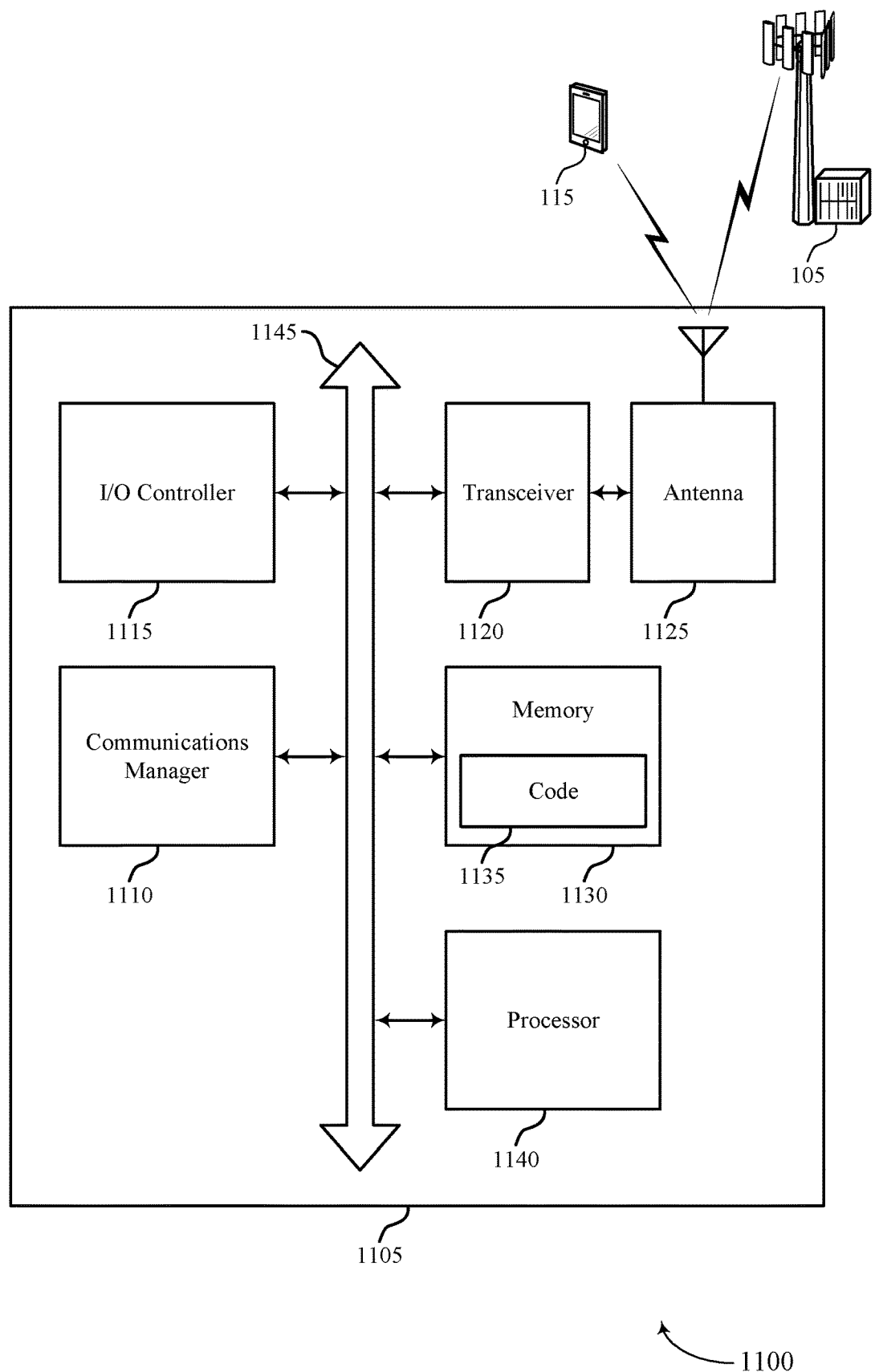
FIG. 11 shows a diagram of a system including a device that supports handling TB-level parity check bits for interrupted transmissions in accordance with aspects of the present disclosure.

FIG. 11 shows a diagram of a system 1100 including a device 1105 that supports handling TB-level parity check bits for interrupted transmissions in accordance with aspects of the present disclosure. The device 1105 may be an example of or include the components of device 805, device 905, or a UE 115 as described herein. The device 1105 may include components for bi-directional voice and data communications including components for transmitting and receiving communications, including a communications manager 1110, an I/O controller 1115, a transceiver 1120, an antenna 1125, memory 1130, and a processor 1140. These components may be in electronic communication via one or more buses (e.g., bus 1145).

The communications manager 1110 may cancel transmission of a TB including a set of code blocks, where a first subset of code blocks of the set of code blocks is encoded for transmission and a second subset of code blocks of the set of code blocks is unencoded for transmission based on the canceling, receive a re-transmission request for a code block of the second subset of code blocks including a set of parity check bits for the TB, determine that a current state of the set of parity check bits for the TB corresponds to the first subset of code blocks based on the canceling, modify the code block including the set of parity check bits for the TB based on the determining, and transmit the modified code block based on the re-transmission request.

Additionally or alternatively, the communications manager 1110 may cancel transmission of a TB including a set of code blocks, where a first subset of code blocks of the set of code blocks is encoded for transmission and a second subset of code blocks of the set of code blocks is unencoded for transmission based on the canceling, encode the second subset of code blocks for transmission based on the modified processing timeline, receive a re-transmission request for a code block of the second subset of code blocks including a set of parity check bits for the TB, modify a processing timeline based on the second subset of code blocks being unencoded for transmission, and transmit the code block based on the re-transmission request and encoding the second subset of code blocks for transmission.

The I/O controller 1115 may manage input and output signals for the device 1105. The I/O controller 1115 may also manage peripherals not integrated into the device 1105. In some cases, the I/O controller 1115 may represent a physical connection or port to an external peripheral. In some cases, the I/O controller 1115 may utilize an operating system such as iOS®, ANDROID®, MS-DOS®, MS-WINDOWS®, OS/2®, UNIX®, LINUX®, or another known operating system. In other cases, the I/O controller 1115 may represent or interact with a modem, a keyboard, a mouse, a touchscreen, or a similar device. In some cases, the I/O controller 1115 may be implemented as part of a processor. In some cases, a user may interact with the device 1105 via the I/O controller 1115 or via hardware components controlled by the I/O controller 1115.

The transceiver 1120 may communicate bi-directionally, via one or more antennas, wired, or wireless links as described herein. For example, the transceiver 1120 may represent a wireless transceiver and may communicate bi-directionally with another wireless transceiver. The transceiver 1120 may also include a modem to modulate the packets and provide the modulated packets to the antennas for transmission, and to demodulate packets received from the antennas.

In some cases, the wireless device may include a single antenna 1125. However, in some cases the device may have more than one antenna 1125, which may be capable of concurrently transmitting or receiving multiple wireless transmissions.

The memory 1130 may include random access memory (RAM) and read-only memory (ROM). The memory 1130 may store computer-readable, computer-executable code 1135 including instructions that, when executed, cause the processor to perform various functions described herein. In some cases, the memory 1130 may contain, among other things, a basic I/O system (BIOS) which may control basic hardware or software operation such as the interaction with peripheral components or devices.

The processor 1140 may include an intelligent hardware device (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, the processor 1140 may be configured to operate a memory array using a memory controller. In other cases, a memory controller may be integrated into the processor 1140. The processor 1140 may be configured to execute computer-readable instructions stored in a memory (e.g., the memory 1130) to cause the device 1105 to perform various functions (e.g., functions or tasks supporting handling TB-level parity check bits for interrupted transmissions).

The code 1135 may include instructions to implement aspects of the present disclosure, including instructions to support wireless communications. The code 1135 may be stored in a non-transitory computer-readable medium such as system memory or other type of memory. In some cases, the code 1135 may not be directly executable by the processor 1140 but may cause a computer (e.g., when compiled and executed) to perform functions described herein.

Figure 12:
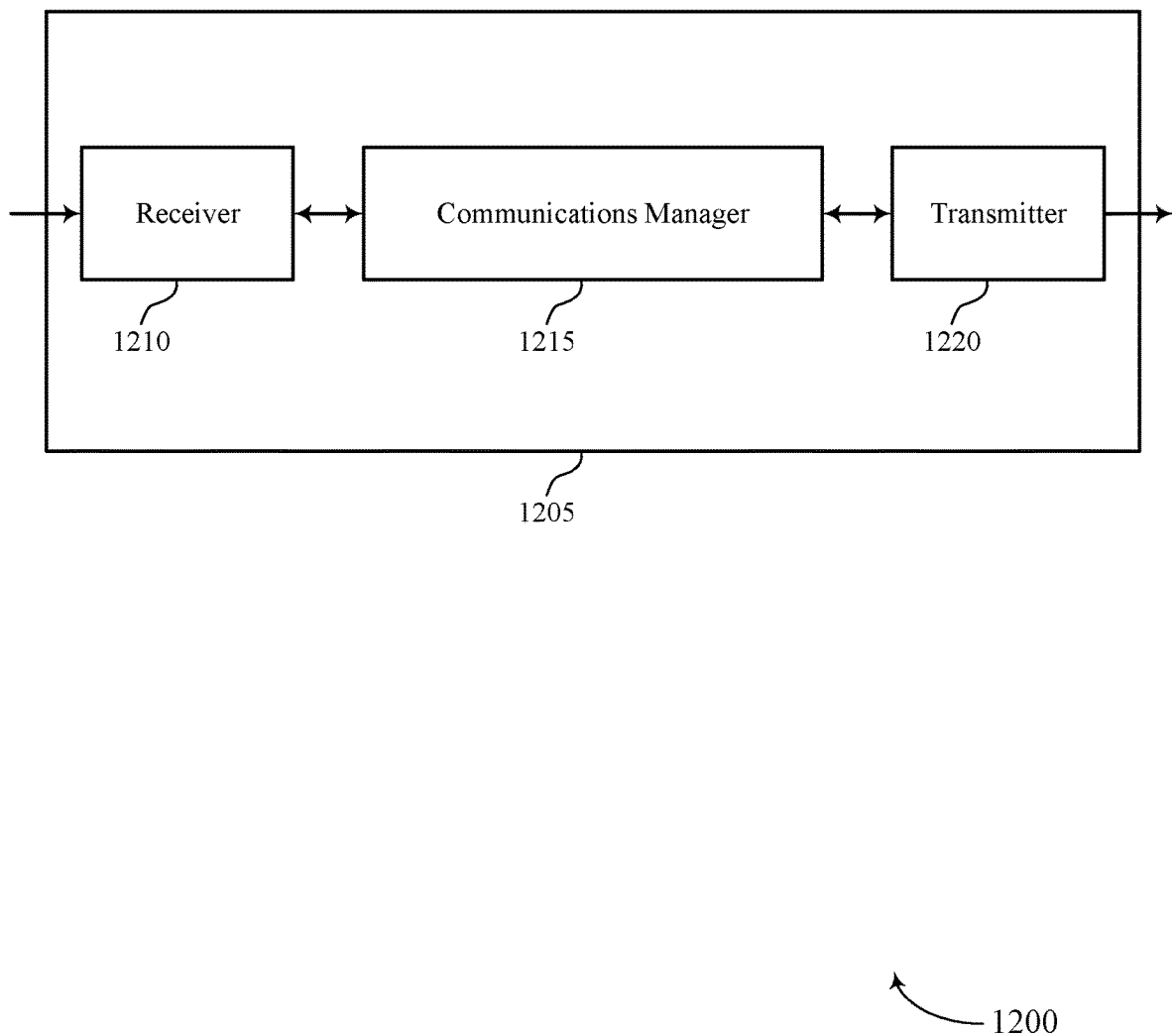
FIGS. 12 and 13 show block diagrams of devices that support handling TB-level parity check bits for interrupted transmissions in accordance with aspects of the present disclosure.

FIG. 12 shows a block diagram 1200 of a device 1205 that supports handling TB-level parity check bits for interrupted transmissions in accordance with aspects of the present disclosure. The device 1205 may be an example of aspects of a base station 105 as described herein. The device 1205 may include a receiver 1210, a communications manager 1215, and a transmitter 1220. The device 1205 may also include a processor. Each of these components may be in communication with one another (e.g., via one or more buses).

The receiver 1210 may receive information such as packets, user data, or control information associated with various information channels (e.g., control channels, data channels, and information related to handling TB-level parity check bits for interrupted transmissions, etc.). Information may be passed on to other components of the device 1205. The receiver 1210 may be an example of aspects of the transceiver 1520 described with reference to FIG. 15. The receiver 1210 may utilize a single antenna or a set of antennas.

In one implementation, the communications manager 1215 may receive, from a UE, a first subset of code blocks of a TB, where transmission of the TB is scheduled for a first set of resources, transmit a message indicating a second set of resources overlapping in time with at least a portion of the first set of resources, determine that transmission of a second subset of code blocks of the TB by the UE is preempted based on the message, where the second subset of code blocks includes a code block including a set of parity check bits for the TB, and request re-transmission of at least the second subset of code blocks based on the determining. This implementation may be used to improve the reliability of receiving the re-transmission at the base station 105, as the base station 105 may improve the likelihood that the UE 115 can process and transmit the re-transmission in the indicated resources.

Furthermore, based on requesting re-transmission of at least the second subset of code blocks, a processor of the base station 105 (e.g., controlling the receiver 1210, the communication manager 1215, and/or the transmitter 1220) may reduce the processing resources wasted monitoring for code blocks that are not ready for transmission. In some cases, a decoder may reduce a number of unsuccessful decoding operations performed, reducing the power needed at the decoder to process the re-transmission.

Additionally or alternatively, in another implementation, the communications manager 1215 may receive, from a UE, a first subset of code blocks of a TB, where transmission of the TB is scheduled for a first set of resources, transmit a message indicating a second set of resources overlapping in time with at least a portion of the first set of resources, determine that transmission of a second subset of code blocks of the TB by the UE is preempted based on the message, where the second subset of code blocks includes a code block including a set of parity check bits for the TB, and transmit a re-transmission request message for the code block, where the re-transmission request message indicates a resource for transmission of the code block that is based on a processing timeline for the UE and the second subset of code blocks being preempted. This implementation may be used to improve reliability of re-transmissions by the UE 115, as the UE 115 may process information in time to transmit within an allocated resource. Accordingly, the base station 105 may reduce the processing power used to monitor for and decode the re-transmission. This may reduce signaling overhead in the system, as the number of re-transmissions by the UE 115 may be reduced.

Furthermore, based on the re-transmission request message indicating a resource for transmission of the code block that is based on a processing timeline for the UE 115 and the second subset of code blocks being preempted, a processor of the base station 105 (e.g., controlling the receiver 1210, the communication manager 1215, and/or the transmitter 1220) may reduce the processing resources wasted monitoring for code blocks that are not ready for transmission. In some cases, a decoder may reduce a number of unsuccessful decoding operations performed, reducing the power needed at the decoder to process the re-transmission.

The communications manager 1215 may be an example of aspects of the communications manager 1510 described herein. The communications manager 1215, or its sub-components, may be implemented in hardware, code (e.g., software or firmware) executed by a processor, or any combination thereof. If implemented in code executed by a processor, the functions of the communications manager 1215, or its sub-components may be executed by a general-purpose processor, a DSP, an ASIC, an FPGA or other programmable logic device, discrete gate or transistor logic, discrete hardware components, or any combination thereof designed to perform the functions described in the present disclosure.

The communications manager 1215, or its sub-components, may be physically located at various positions, including being distributed such that portions of functions are implemented at different physical locations by one or more physical components. In some examples, the communications manager 1215, or its sub-components, may be a separate and distinct component in accordance with various aspects of the present disclosure. In some examples, the communications manager 1215, or its sub-components, may be combined with one or more other hardware components, including but not limited to an I/O component, a transceiver, a network server, another computing device, one or more other components described in the present disclosure, or a combination thereof in accordance with various aspects of the present disclosure.

The transmitter 1220 may transmit signals generated by other components of the device 1205. In some examples, the transmitter 1220 may be collocated with a receiver 1210 in a transceiver module. For example, the transmitter 1220 may be an example of aspects of the transceiver 1520 described with reference to FIG. 15. The transmitter 1220 may utilize a single antenna or a set of antennas.

Figure 13:
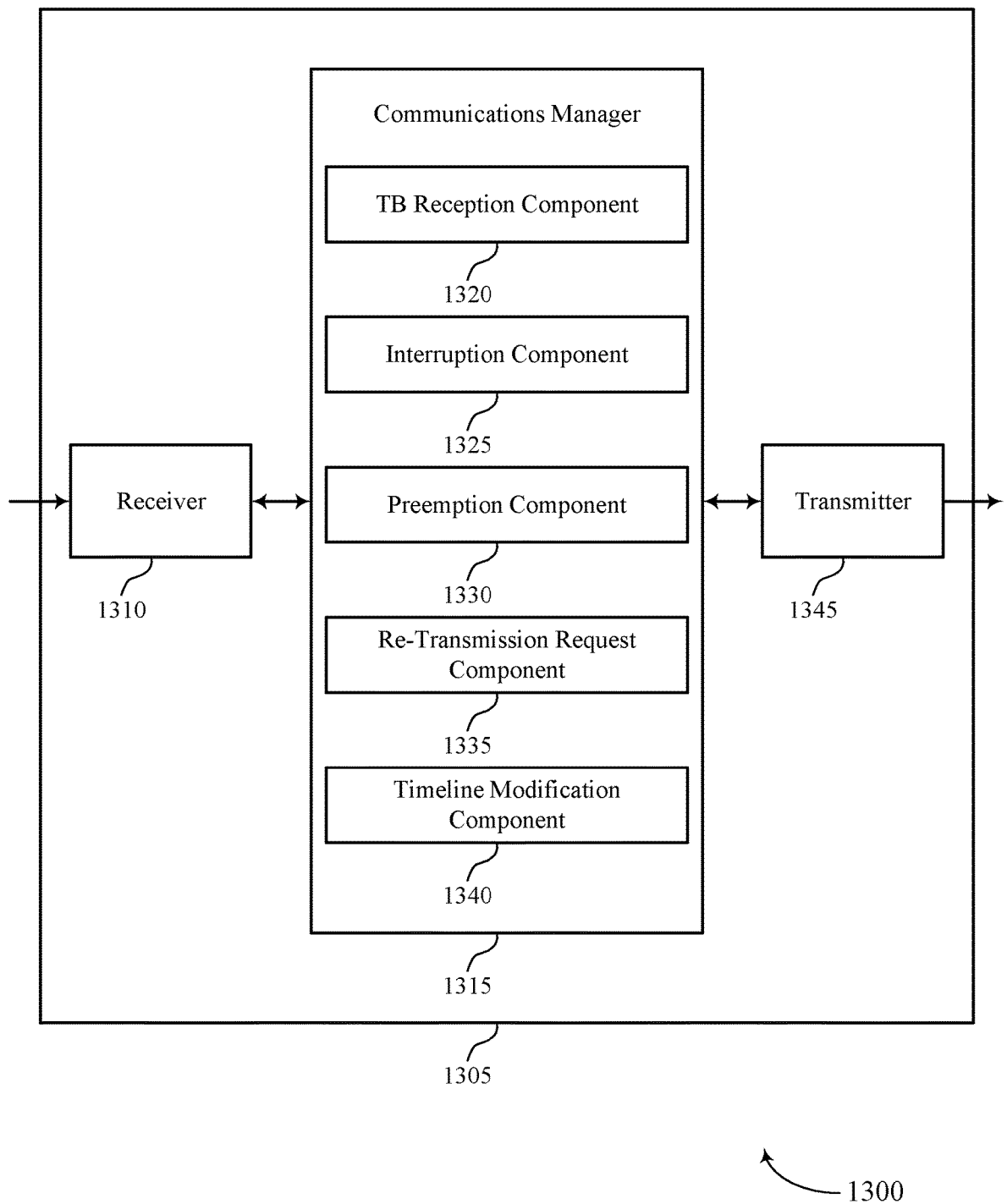

FIG. 13 shows a block diagram 1300 of a device 1305 that supports handling TB-level parity check bits for interrupted transmissions in accordance with aspects of the present disclosure. The device 1305 may be an example of aspects of a device 1205, or a base station 105 as described herein. The device 1305 may include a receiver 1310, a communications manager 1315, and a transmitter 1345. The device 1305 may also include a processor. Each of these components may be in communication with one another (e.g., via one or more buses).

The receiver 1310 may receive information such as packets, user data, or control information associated with various information channels (e.g., control channels, data channels, and information related to handling TB-level parity check bits for interrupted transmissions, etc.). Information may be passed on to other components of the device 1305. The receiver 1310 may be an example of aspects of the transceiver 1520 described with reference to FIG. 15. The receiver 1310 may utilize a single antenna or a set of antennas.

The communications manager 1315 may be an example of aspects of the communications manager 1215 as described herein. The communications manager 1315 may include a TB reception component 1320, an interruption component 1325, a preemption component 1330, a re-transmission request component 1335, and a timeline modification component 1340. The communications manager 1315 may be an example of aspects of the communications manager 1510 described herein.

In some cases, the TB reception component 1320 may receive, from a UE, a first subset of code blocks of a TB, where transmission of the TB is scheduled for a first set of resources. The interruption component 1325 may transmit a message indicating a second set of resources overlapping in time with at least a portion of the first set of resources. The preemption component 1330 may determine that transmission of a second subset of code blocks of the TB by the UE is preempted based on the message, where the second subset of code blocks includes a code block including a set of parity check bits for the TB. The re-transmission request component 1335 may request re-transmission of at least the second subset of code blocks based on the determining.

In some other cases, the TB reception component 1320 may receive, from a UE, a first subset of code blocks of a TB, where transmission of the TB is scheduled for a first set of resources. The interruption component 1325 may transmit a message indicating a second set of resources overlapping in time with at least a portion of the first set of resources. The preemption component 1330 may determine that transmission of a second subset of code blocks of the TB by the UE is preempted based on the message, where the second subset of code blocks includes a code block including a set of parity check bits for the TB. The timeline modification component 1340 may transmit a re-transmission request message for the code block, where the re-transmission request message indicates a resource for transmission of the code block that is based on a processing timeline for the UE and the second subset of code blocks being preempted.

The transmitter 1345 may transmit signals generated by other components of the device 1305. In some examples, the transmitter 1345 may be collocated with a receiver 1310 in a transceiver module. For example, the transmitter 1345 may be an example of aspects of the transceiver 1520 described with reference to FIG. 15. The transmitter 1345 may utilize a single antenna or a set of antennas.

Figure 14:
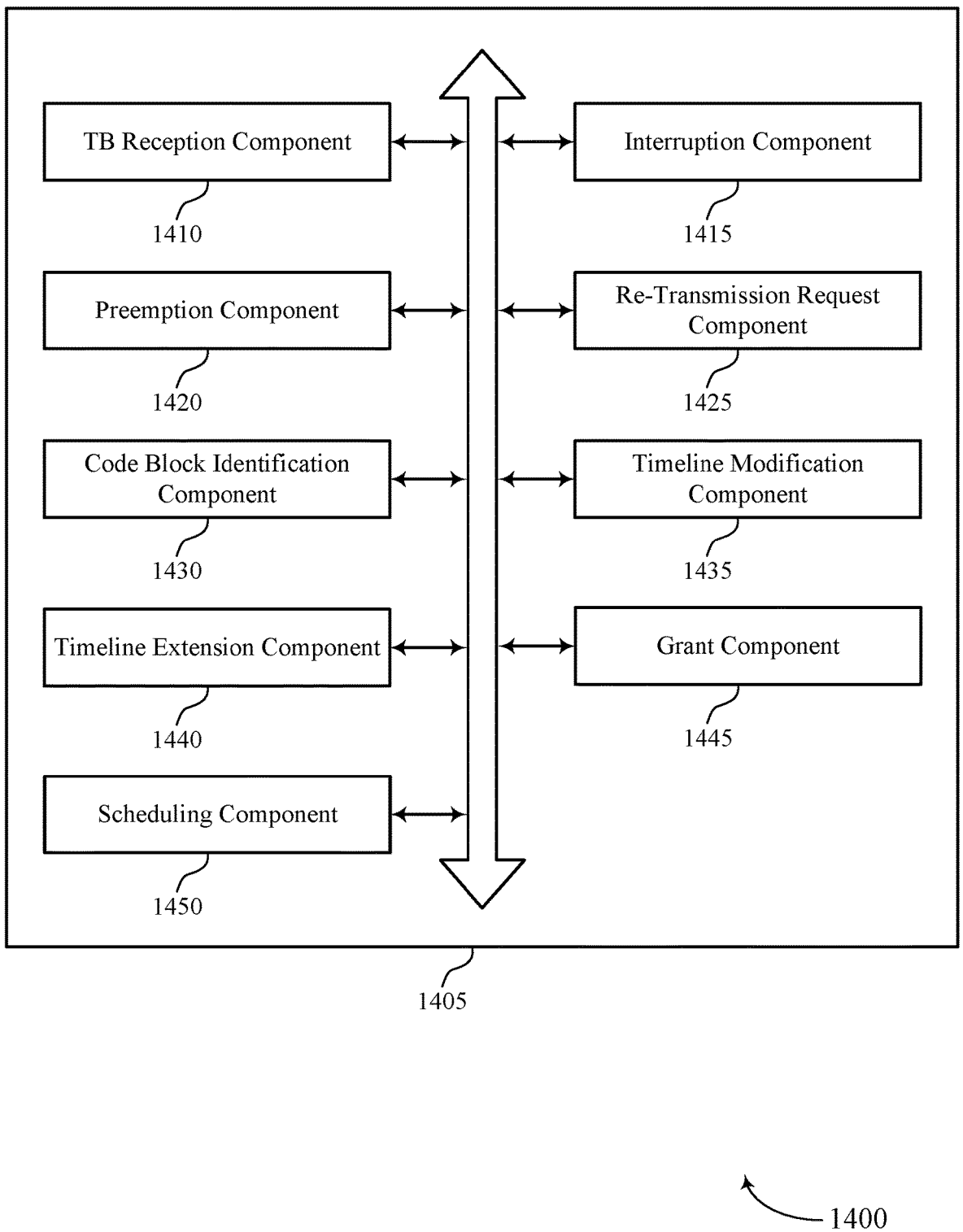
FIG. 14 shows a block diagram of a communications manager that supports handling TB-level parity check bits for interrupted transmissions in accordance with aspects of the present disclosure.

FIG. 14 shows a block diagram 1400 of a communications manager 1405 that supports handling TB-level parity check bits for interrupted transmissions in accordance with aspects of the present disclosure. The communications manager 1405 may be an example of aspects of a communications manager 1215, a communications manager 1315, or a communications manager 1510 described herein. The communications manager 1405 may include a TB reception component 1410, an interruption component 1415, a preemption component 1420, a re-transmission request component 1425, a code block identification component 1430, a timeline modification component 1435, a timeline extension component 1440, a grant component 1445, a scheduling component 1450, or a combination thereof. Each of these modules may communicate, directly or indirectly, with one another (e.g., via one or more buses).

In a first implementation, the TB reception component 1410 may receive, from a UE, a first subset of code blocks of a TB, where transmission of the TB is scheduled for a first set of resources. In some cases, the transmission of the TB includes an initial transmission of the TB by the UE.

The interruption component 1415 may transmit a message indicating a second set of resources overlapping in time with at least a portion of the first set of resources. In some cases, the message indicating the second set of resources includes a grant for a second transmission in the second set of resources. In some other cases, the message indicating the second set of resources requests the UE to refrain from transmitting in the second set of resources.

The preemption component 1420 may determine that transmission of a second subset of code blocks of the TB by the UE is preempted based on the message, where the second subset of code blocks includes a code block including a set of parity check bits for the TB. In some cases, the set of parity check bits is a set of CRC bits.

The re-transmission request component 1425 may request re-transmission of at least the second subset of code blocks based on the determining. In some examples, requesting the re-transmission may involve the re-transmission request component 1425 transmitting a set of re-transmission request messages for a set of CBGs including at least the second subset of code blocks, where a re-transmission request message for a CBG including the code block with the set of parity check bits for the TB is transmitted subsequent to each other re-transmission request message of the set of re-transmission request messages. In some examples, the re-transmission request component 1425 may request re-transmission of each code block of the TB based on the determining. In some examples, the re-transmission request component 1425 may request re-transmission of the TB based on the determining. In some examples, requesting re-transmission of the TB may involve the re-transmission request component 1425 requesting re-transmission of the TB based on a configuration of the base station, where the configuration enables preemption of transmissions by the UE and disables CBG-level re-transmission requests by the base station.

The code block identification component 1430 may identify the second subset of code blocks based on the second subset of code blocks being scheduled for transmission at least partially overlapping in time with the second set of resources.

In a second implementation, the TB reception component 1410 may receive, from a UE, a first subset of code blocks of a TB, where transmission of the TB is scheduled for a first set of resources. The interruption component 1415 may transmit a message indicating a second set of resources overlapping in time with at least a portion of the first set of resources. The preemption component 1420 may determine that transmission of a second subset of code blocks of the TB by the UE is preempted based on the message, where the second subset of code blocks includes a code block including a set of parity check bits for the TB. The timeline modification component 1435 may transmit a re-transmission request message for the code block, where the re-transmission request message indicates a resource for transmission of the code block that is based on a processing timeline for the UE and the second subset of code blocks being preempted.

The timeline extension component 1440 may determine a timeline extension based on the second subset of code blocks being preempted and may add the timeline extension to the processing timeline for the UE to determine the resource for transmission of the code block. In some cases, the timeline extension is a configured value. In some other cases, the timeline extension component 1440 may calculate the timeline extension based on a number of code blocks in the second subset of code blocks being preempted, a length of the TB, or a combination thereof.

In a third implementation, the grant component 1445 may transmit a first grant of a first set of resources for a first uplink transmission and may transmit a second grant of a second set of resources for a second uplink transmission, where the second set of resources for the second uplink transmission at least partially overlaps in time with the first set of resources for the first uplink transmission. The scheduling component 1450 may schedule a third set of resources for a third uplink transmission according to a non-overlap condition between the third set of resources and the first set of resources. The grant component 1445 may transmit a third grant of the third set of resources for the third uplink transmission based on the scheduling. In some cases, the TB reception component 1410 may receive the third uplink transmission based on the third grant and the scheduling.

Figure 15:
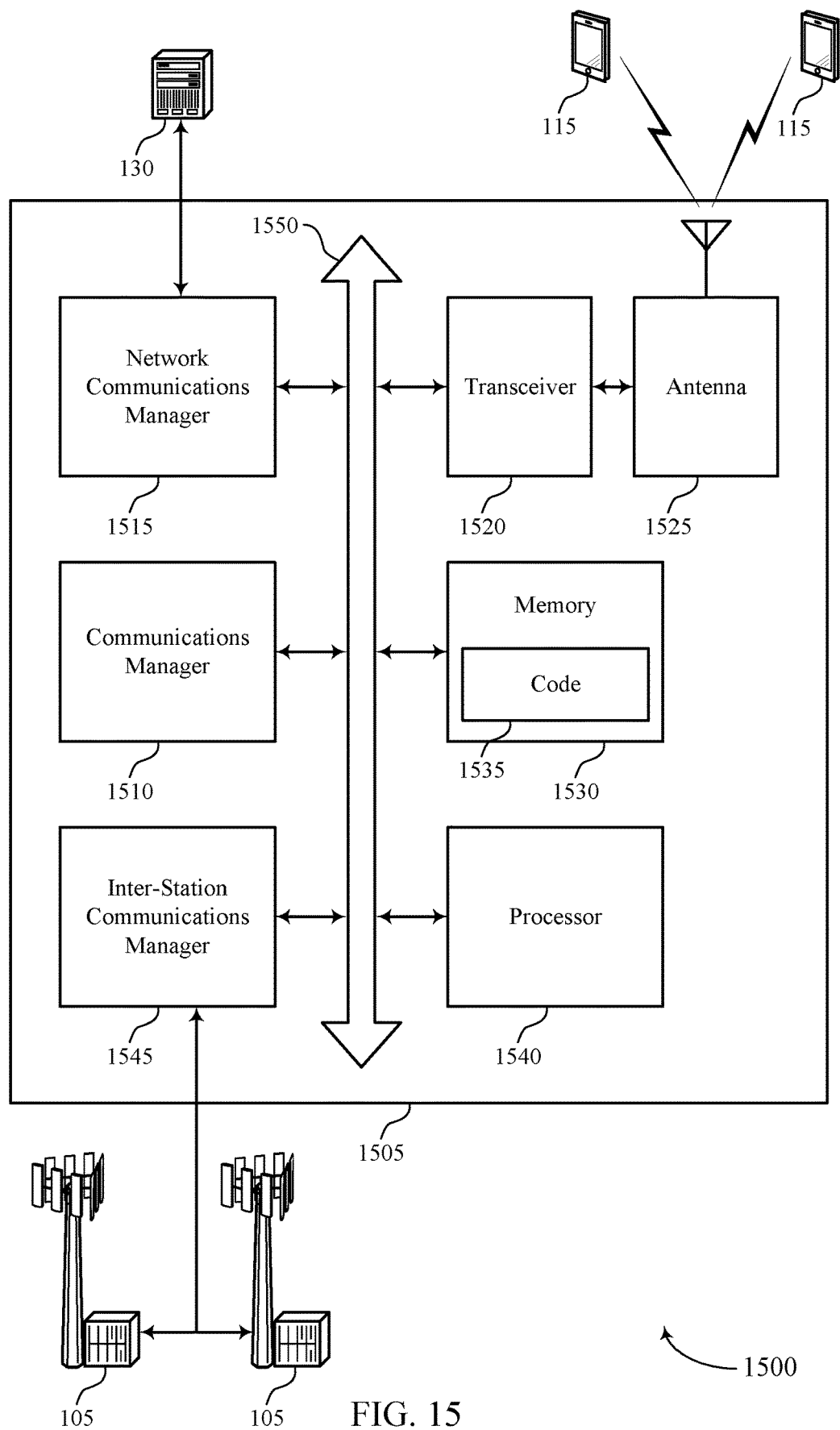
FIG. 15 shows a diagram of a system including a device that supports handling TB-level parity check bits for interrupted transmissions in accordance with aspects of the present disclosure.

FIG. 15 shows a diagram of a system 1500 including a device 1505 that supports handling TB-level parity check bits for interrupted transmissions in accordance with aspects of the present disclosure. The device 1505 may be an example of or include the components of device 1205, device 1305, or a base station 105 as described herein. The device 1505 may include components for bi-directional voice and data communications including components for transmitting and receiving communications, including a communications manager 1510, a network communications manager 1515, a transceiver 1520, an antenna 1525, memory 1530, a processor 1540, and an inter-station communications manager 1545. These components may be in electronic communication via one or more buses (e.g., bus 1550).

The communications manager 1510 may receive, from a UE, a first subset of code blocks of a TB, where transmission of the TB is scheduled for a first set of resources, transmit a message indicating a second set of resources overlapping in time with at least a portion of the first set of resources, determine that transmission of a second subset of code blocks of the TB by the UE is preempted based on the message, where the second subset of code blocks includes a code block including a set of parity check bits for the TB, and request re-transmission of at least the second subset of code blocks based on the determining.

Additionally or alternatively, the communications manager 1510 may receive, from a UE, a first subset of code blocks of a TB, where transmission of the TB is scheduled for a first set of resources, transmit a message indicating a second set of resources overlapping in time with at least a portion of the first set of resources, determine that transmission of a second subset of code blocks of the TB by the UE is preempted based on the message, where the second subset of code blocks includes a code block including a set of parity check bits for the TB, and transmit a re-transmission request message for the code block, where the re-transmission request message indicates a resource for transmission of the code block that is based on a processing timeline for the UE and the second subset of code blocks being preempted.

The network communications manager 1515 may manage communications with the core network 130 (e.g., via one or more wired backhaul links). For example, the network communications manager 1515 may manage the transfer of data communications for client devices, such as one or more UEs 115.

The transceiver 1520 may communicate bi-directionally, via one or more antennas, wired, or wireless links as described herein. For example, the transceiver 1520 may represent a wireless transceiver and may communicate bi-directionally with another wireless transceiver. The transceiver 1520 may also include a modem to modulate the packets and provide the modulated packets to the antennas for transmission, and to demodulate packets received from the antennas.

In some cases, the wireless device may include a single antenna 1525. However, in some cases the device may have more than one antenna 1525, which may be capable of concurrently transmitting or receiving multiple wireless transmissions.

The memory 1530 may include RAM, ROM, or a combination thereof. The memory 1530 may store computer-readable code 1535 including instructions that, when executed by a processor (e.g., the processor 1540) cause the device to perform various functions described herein. In some cases, the memory 1530 may contain, among other things, a BIOS which may control basic hardware or software operation such as the interaction with peripheral components or devices.

The processor 1540 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1540 may be configured to operate a memory array using a memory controller. In some cases, a memory controller may be integrated into processor 1540. The processor 1540 may be configured to execute computer-readable instructions stored in a memory (e.g., the memory 1530) to cause the device 1505 to perform various functions (e.g., functions or tasks supporting handling TB-level parity check bits for interrupted transmissions).

The inter-station communications manager 1545 may manage communications with other base station 105 and may include a controller or scheduler for controlling communications with UEs 115 in cooperation with other base stations 105. For example, the inter-station communications manager 1545 may coordinate scheduling for transmissions to UEs 115 for various interference mitigation techniques such as beamforming or joint transmission. In some examples, the inter-station communications manager 1545 may provide an X2 interface within an LTE/LTE-A wireless communication network technology to provide communication between base stations 105.

The code 1535 may include instructions to implement aspects of the present disclosure, including instructions to support wireless communications. The code 1535 may be stored in a non-transitory computer-readable medium such as system memory or other type of memory. In some cases, the code 1535 may not be directly executable by the processor 1540 but may cause a computer (e.g., when compiled and executed) to perform functions described herein.

Figure 16:
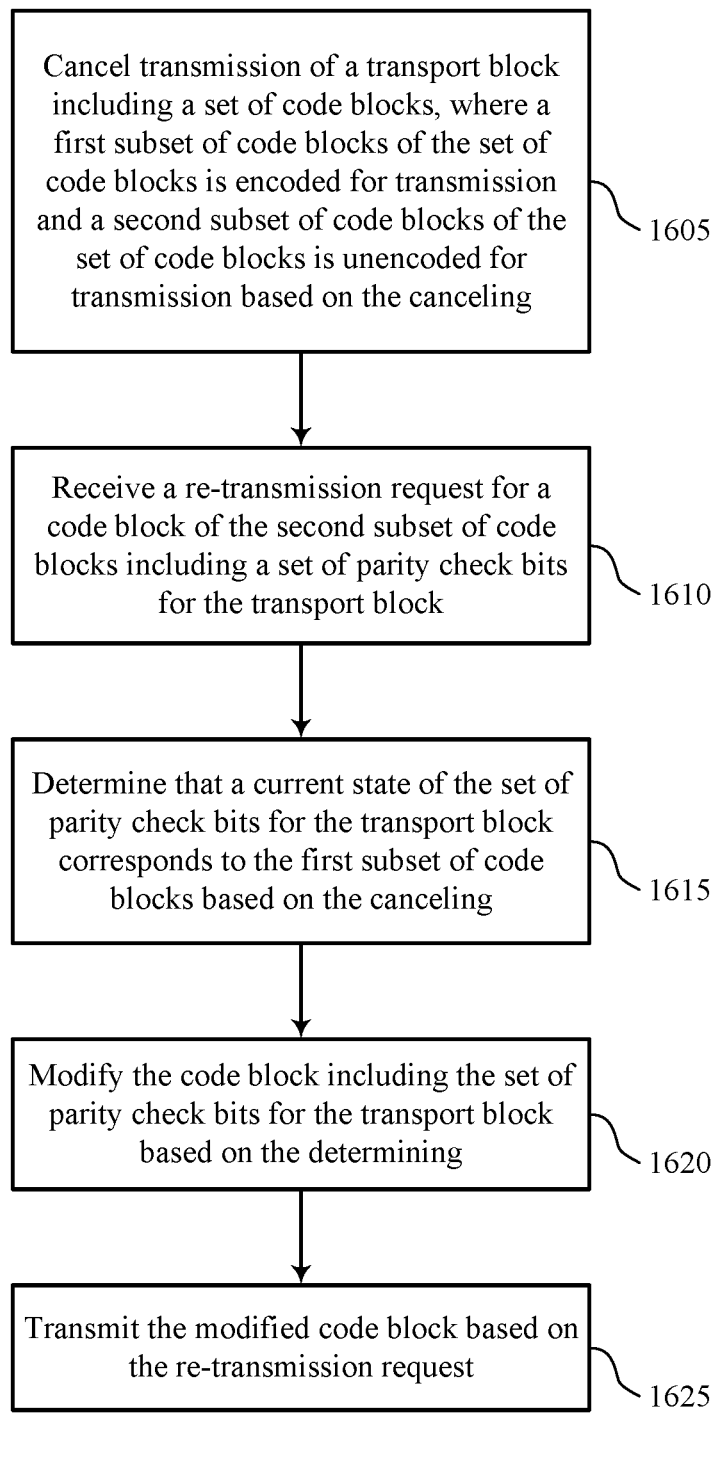
FIGS. 16 through 19 show flowcharts illustrating methods that support handling TB-level parity check bits for interrupted transmissions in accordance with aspects of the present disclosure.

FIG. 16 shows a flowchart illustrating a method 1600 that supports handling TB-level parity check bits for interrupted transmissions in accordance with aspects of the present disclosure. The operations of method 1600 may be implemented by a UE 115 or its components as described herein. For example, the operations of method 1600 may be performed by a communications manager as described with reference to FIGS. 8 through 11. In some examples, a UE may execute a set of instructions to control the functional elements of the UE to perform the functions described herein. Additionally or alternatively, a UE may perform aspects of the functions described herein using special-purpose hardware.

At 1605, the UE may cancel transmission of a TB including a set of code blocks, where a first subset of code blocks of the set of code blocks is encoded for transmission and a second subset of code blocks of the set of code blocks is unencoded for transmission based on the canceling. The operations of 1605 may be performed according to the methods described herein. In some examples, aspects of the operations of 1605 may be performed by an encoder as described with reference to FIGS. 8 through 11.

At 1610, the UE may receive a re-transmission request for a code block of the second subset of code blocks including a set of parity check bits for the TB. The operations of 1610 may be performed according to the methods described herein. In some examples, aspects of the operations of 1610 may be performed by a re-transmission request component as described with reference to FIGS. 8 through 11.

At 1615, the UE may determine that a current state of the set of parity check bits for the TB corresponds to the first subset of code blocks based on the canceling. The operations of 1615 may be performed according to the methods described herein. In some examples, aspects of the operations of 1615 may be performed by a CRC state component as described with reference to FIGS. 8 through 11.

At 1620, the UE may modify the code block including the set of parity check bits for the TB based on the determining. The operations of 1620 may be performed according to the methods described herein. In some examples, aspects of the operations of 1620 may be performed by a code block modification component as described with reference to FIGS. 8 through 11.

At 1625, the UE may transmit the modified code block based on the re-transmission request. The operations of 1625 may be performed according to the methods described herein. In some examples, aspects of the operations of 1625 may be performed by a re-transmission component as described with reference to FIGS. 8 through 11.

Figure 17:
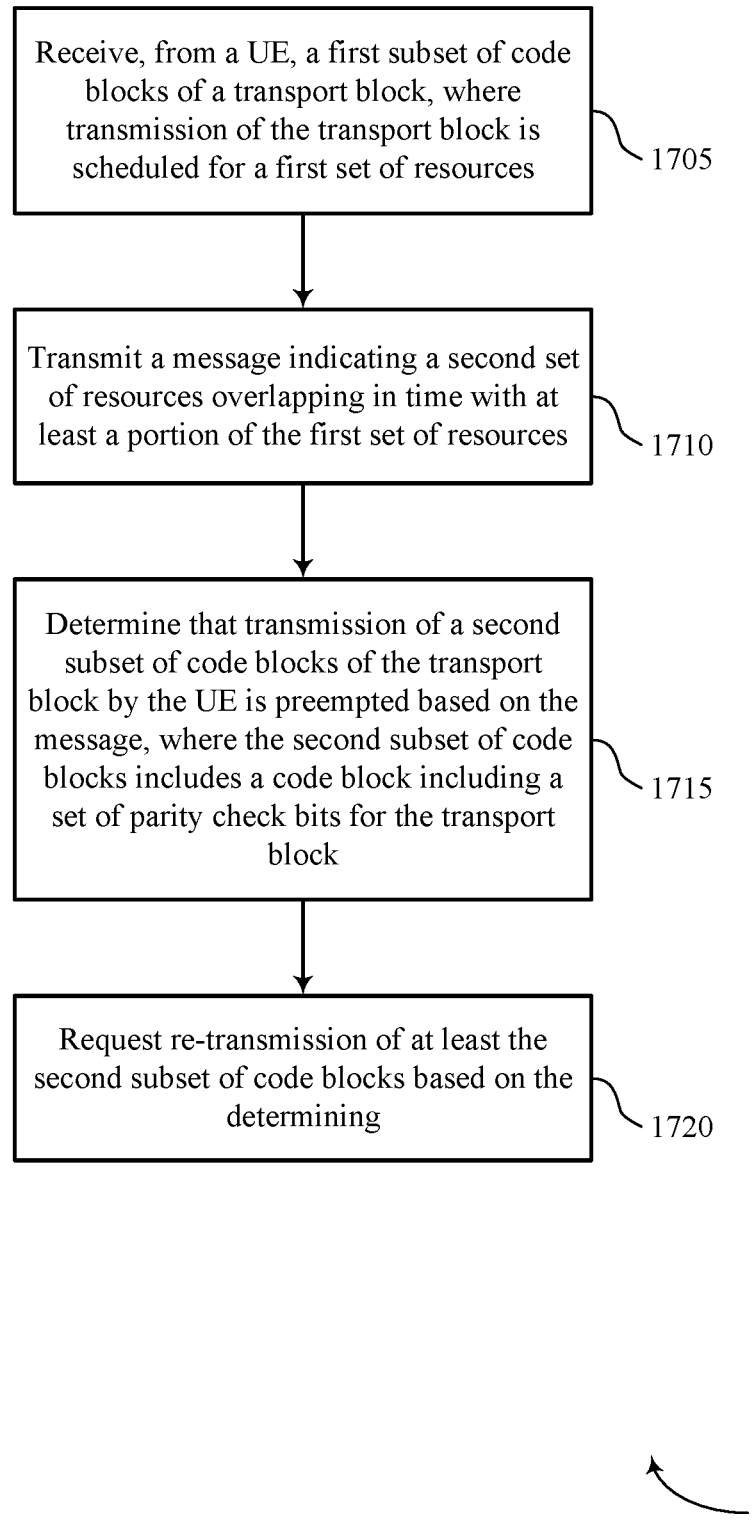

FIG. 17 shows a flowchart illustrating a method 1700 that supports handling TB-level parity check bits for interrupted transmissions in accordance with aspects of the present disclosure. The operations of method 1700 may be implemented by a base station 105 or its components as described herein. For example, the operations of method 1700 may be performed by a communications manager as described with reference to FIGS. 12 through 15. In some examples, a base station may execute a set of instructions to control the functional elements of the base station to perform the functions described herein. Additionally or alternatively, a base station may perform aspects of the functions described herein using special-purpose hardware.

At 1705, the base station may receive, from a UE, a first subset of code blocks of a TB, where transmission of the TB is scheduled for a first set of resources. The operations of 1705 may be performed according to the methods described herein. In some examples, aspects of the operations of 1705 may be performed by a TB reception component as described with reference to FIGS. 12 through 15.

At 1710, the base station may transmit a message indicating a second set of resources overlapping in time with at least a portion of the first set of resources. The operations of 1710 may be performed according to the methods described herein. In some examples, aspects of the operations of 1710 may be performed by an interruption component as described with reference to FIGS. 12 through 15.

At 1715, the base station may determine that transmission of a second subset of code blocks of the TB by the UE is preempted based on the message, where the second subset of code blocks includes a code block including a set of parity check bits for the TB. The operations of 1715 may be performed according to the methods described herein. In some examples, aspects of the operations of 1715 may be performed by a preemption component as described with reference to FIGS. 12 through 15.

At 1720, the base station may request re-transmission of at least the second subset of code blocks based on the determining. The operations of 1720 may be performed according to the methods described herein. In some examples, aspects of the operations of 1720 may be performed by a re-transmission request component as described with reference to FIGS. 12 through 15.

Figure 18:
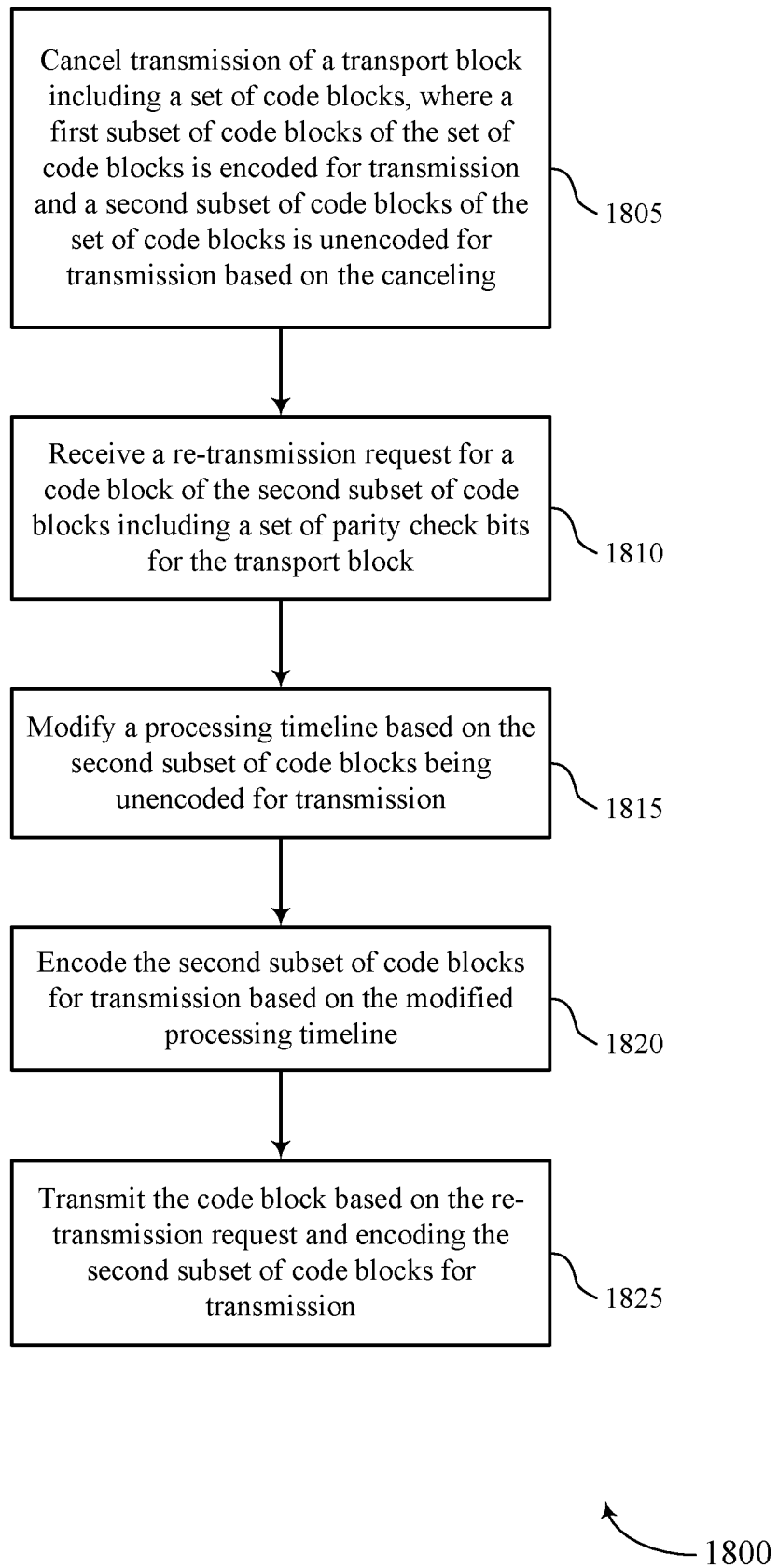

FIG. 18 shows a flowchart illustrating a method 1800 that supports handling TB-level parity check bits for interrupted transmissions in accordance with aspects of the present disclosure. The operations of method 1800 may be implemented by a UE 115 or its components as described herein. For example, the operations of method 1800 may be performed by a communications manager as described with reference to FIGS. 8 through 11. In some examples, a UE may execute a set of instructions to control the functional elements of the UE to perform the functions described herein. Additionally or alternatively, a UE may perform aspects of the functions described herein using special-purpose hardware.

At 1805, the UE may cancel transmission of a TB including a set of code blocks, where a first subset of code blocks of the set of code blocks is encoded for transmission and a second subset of code blocks of the set of code blocks is unencoded for transmission based on the canceling. The operations of 1805 may be performed according to the methods described herein. In some examples, aspects of the operations of 1805 may be performed by an encoder as described with reference to FIGS. 8 through 11.

At 1810, the UE may receive a re-transmission request for a code block of the second subset of code blocks including a set of parity check bits for the TB. The operations of 1810 may be performed according to the methods described herein. In some examples, aspects of the operations of 1810 may be performed by a re-transmission request component as described with reference to FIGS. 8 through 11.

At 1815, the UE may modify a processing timeline based on the second subset of code blocks being unencoded for transmission. The operations of 1815 may be performed according to the methods described herein. In some examples, aspects of the operations of 1815 may be performed by a timeline modification component as described with reference to FIGS. 8 through 11.

At 1820, the UE may encode the second subset of code blocks for transmission based on the modified processing timeline. The operations of 1820 may be performed according to the methods described herein. In some examples, aspects of the operations of 1820 may be performed by an encoder as described with reference to FIGS. 8 through 11.

At 1825, the UE may transmit the code block based on the re-transmission request and encoding the second subset of code blocks for transmission. The operations of 1825 may be performed according to the methods described herein. In some examples, aspects of the operations of 1825 may be performed by a re-transmission component as described with reference to FIGS. 8 through 11.

Figure 19:
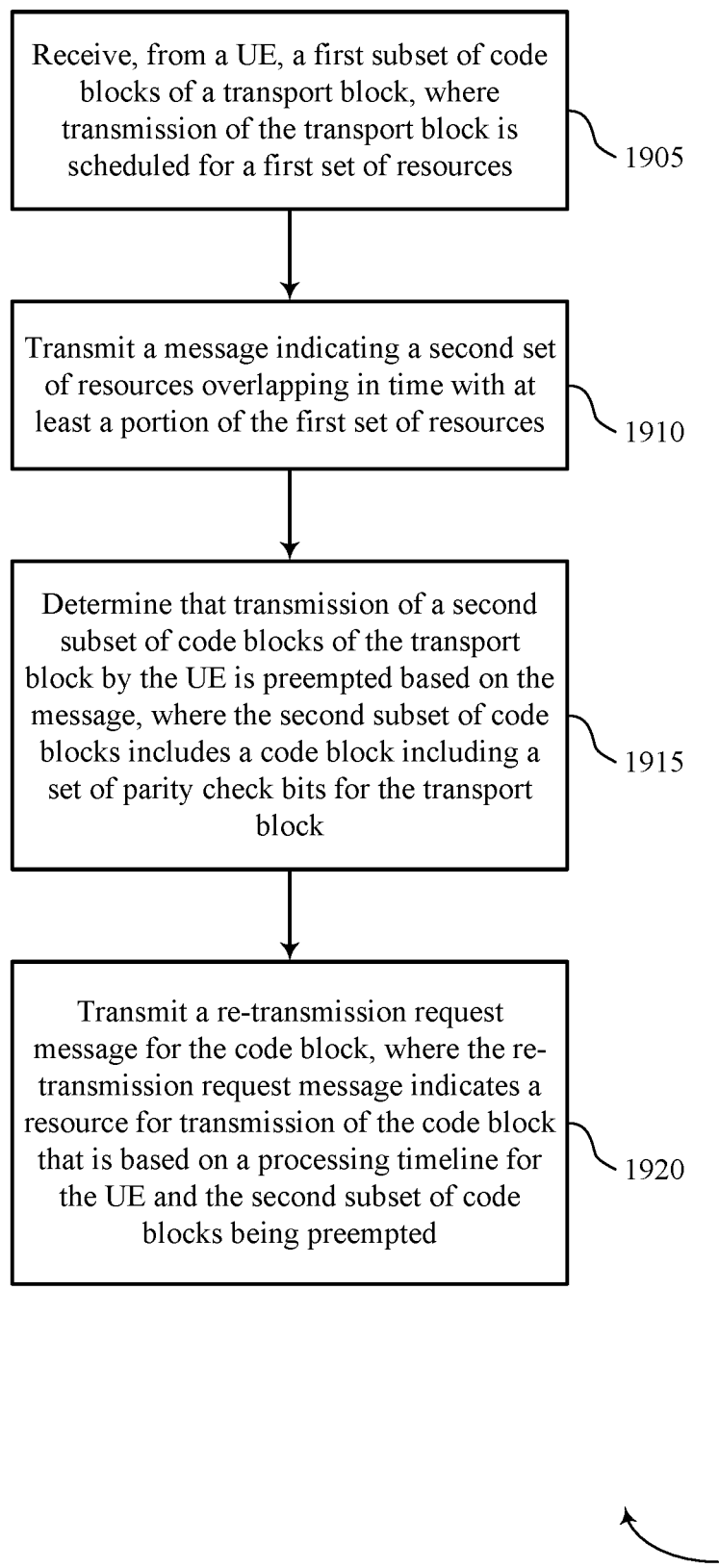

FIG. 19 shows a flowchart illustrating a method 1900 that supports handling TB-level parity check bits for interrupted transmissions in accordance with aspects of the present disclosure. The operations of method 1900 may be implemented by a base station 105 or its components as described herein. For example, the operations of method 1900 may be performed by a communications manager as described with reference to FIGS. 12 through 15. In some examples, a base station may execute a set of instructions to control the functional elements of the base station to perform the functions described herein. Additionally or alternatively, a base station may perform aspects of the functions described herein using special-purpose hardware.

At 1905, the base station may receive, from a UE, a first subset of code blocks of a TB, where transmission of the TB is scheduled for a first set of resources. The operations of 1905 may be performed according to the methods described herein. In some examples, aspects of the operations of 1905 may be performed by a TB reception component as described with reference to FIGS. 12 through 15.

At 1910, the base station may transmit a message indicating a second set of resources overlapping in time with at least a portion of the first set of resources. The operations of 1910 may be performed according to the methods described herein. In some examples, aspects of the operations of 1910 may be performed by an interruption component as described with reference to FIGS. 12 through 15.

At 1915, the base station may determine that transmission of a second subset of code blocks of the TB by the UE is preempted based on the message, where the second subset of code blocks includes a code block including a set of parity check bits for the TB. The operations of 1915 may be performed according to the methods described herein. In some examples, aspects of the operations of 1915 may be performed by a preemption component as described with reference to FIGS. 12 through 15.

At 1920, the base station may transmit a re-transmission request message for the code block, where the re-transmission request message indicates a resource for transmission of the code block that is based on a processing timeline for the UE and the second subset of code blocks being preempted. The operations of 1920 may be performed according to the methods described herein. In some examples, aspects of the operations of 1920 may be performed by a timeline modification component as described with reference to FIGS. 12 through 15.

It should be noted that the methods described herein describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1×, 1×, etc. IS-856 (TIA-856) is commonly referred to as CDMA2000 1×EV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned herein as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs with service subscriptions with the network provider. A small cell may be associated with a lower-powered base station, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA, or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communications at a user equipment (UE), comprising:
    receiving a message preempting transmission of a transport block, the transmission of the transport block associated with a first grant, and the message preempting the transmission of the transport block comprising a second grant for a second transmission overlapping at least one time resource of the first grant, or comprising a request for the UE to refrain from transmitting in the at least one time resource of the first grant, or both;
    canceling the transmission of the transport block based at least in part on receiving the message preempting the transmission of the transport block, wherein the transport block comprises a plurality of code blocks, and wherein a first subset of code blocks of the plurality of code blocks is encoded for transmission and a second subset of code blocks of the plurality of code blocks is unencoded for transmission based at least in part on the canceling;
    receiving a re-transmission request for a code block of the second subset of code blocks comprising a set of parity check bits for the transport block;
    determining that a current state of the set of parity check bits for the transport block corresponds to the first subset of code blocks based at least in part on the canceling;
    modifying the code block comprising the set of parity check bits for the transport block based at least in part on the determining; and
    transmitting the modified code block based at least in part on the re-transmission request.

2. The method of claim 1, wherein the modifying comprises:
    setting each bit of the set of parity check bits for the transport block to a common bit value based at least in part on the determining.

3. The method of claim 2, wherein the common bit value is a zero bit value or a one bit value.

4. The method of claim 1, wherein the modifying comprises:
    removing the set of parity check bits for the transport block from the code block based at least in part on the determining.

5. The method of claim 4, wherein the modifying further comprises:
    rate-matching the code block based at least in part on removing the set of parity check bits for the transport block from the code block.

6. The method of claim 1, further comprising:
    transmitting, for the transport block, the first subset of code blocks based at least in part on the first subset of code blocks being encoded for transmission.

7. The method of claim 6, wherein the transmitting, for the transport block, the first subset of code blocks comprises an initial transmission of the transport block by the UE.

8. The method of claim 1, wherein the set of parity check bits comprises a set of cyclic redundancy check bits.

9. A method for wireless communications at a network device, comprising: receiving a first subset of code blocks of a transport block associated with a first grant, wherein transmission of the transport block is scheduled for a first set of resources; transmitting a message indicating a second set of resources overlapping in time with at least a portion of the first set of resources, the message comprising a second grant for a second transmission in the second set of resources, or comprising a request for a user equipment (UE) to refrain from transmitting in at least one time resource of the first set of resources, or both; determining that transmission of a second subset of code blocks of the transport block by the UE is preempted based at least in part on the message, the second subset of code blocks identified based at least in part on the second subset of code blocks being scheduled for transmission at least partially overlapping in time with the second set of resources, wherein the second subset of code blocks comprises a code block comprising a set of parity check bits for the transport block; and requesting re-transmission of at least the second subset of code blocks based at least in part on the determining.

10. The method of claim 9, wherein requesting re-transmission further comprises:
    transmitting one or more re-transmission request messages for a plurality of code block groups comprising at least the second subset of code blocks, wherein a re-transmission request message for a code block group comprising the code block comprising the set of parity check bits for the transport block is transmitted subsequent to each other re-transmission request message of the one or more re-transmission request messages.

11. The method of claim 10, wherein requesting re-transmission further comprises:
requesting re-transmission of each code block of the transport block based at least in part on the determining.

12. The method of claim 9, wherein requesting re-transmission further comprises:
requesting re-transmission of the transport block based at least in part on the determining.

13. The method of claim 12, wherein requesting re-transmission of the transport block comprises:
requesting re-transmission of the transport block based at least in part on a configuration of the network device, wherein the configuration enables preemption of transmissions by the UE and disables code block group-level re-transmission requests by the network device.

14. The method of claim 9, wherein the set of parity check bits comprises a set of cyclic redundancy check bits.

15. A method for wireless communications at a user equipment (UE), comprising:
canceling transmission of a transport block comprising a plurality of code blocks, wherein a first subset of code blocks of the plurality of code blocks is encoded for transmission and a second subset of code blocks of the plurality of code blocks is unencoded for transmission based at least in part on the canceling;
receiving a re-transmission request for a code block of the second subset of code blocks comprising a set of parity check bits for the transport block;
determining a timeline extension based at least in part on the second subset of code blocks being unencoded for transmission;
modifying a processing timeline based at least in part on adding the timeline extension to the processing timeline;
encoding the second subset of code blocks for transmission based at least in part on the modified processing timeline; and
transmitting the code block based at least in part on the re-transmission request and encoding the second subset of code blocks for transmission.

16. The method of claim 15, wherein modifying the processing timeline comprises:
modifying the processing timeline for transmitting the code block based at least in part on the re-transmission request.

17. The method of claim 15, further comprising:
receiving a message comprising a grant for a second transmission, wherein the canceling is based at least in part on the grant for the second transmission and modifying the processing timeline comprises:
modifying the processing timeline for the second transmission based at least in part on the second subset of code blocks being unencoded for transmission.

18. The method of claim 15, wherein the timeline extension comprises a configured value.

19. The method of claim 15, further comprising:
calculating the timeline extension based at least in part on a number of code blocks in the second subset of code blocks, a length of the transport block, or a combination thereof.

20. The method of claim 15, further comprising:
calculating the set of parity check bits for the transport block based at least in part on encoding the second subset of code blocks for transmission.

21. A method for wireless communications at a user equipment (UE), comprising:
receiving a first grant of a first set of resources for a first uplink transmission;
receiving a second grant of a second set of resources for a second uplink transmission, wherein the second set of resources for the second uplink transmission at least partially overlaps in time with the first set of resources for the first uplink transmission;
canceling, based at least in part on receiving the second grant, transmission of a transport block comprising a plurality of code blocks, wherein the transport block is associated with the first uplink transmission, and wherein a first subset of code blocks of the plurality of code blocks is encoded for transmission and a second subset of code blocks of the plurality of code blocks is unencoded for transmission based at least in part on the canceling;
receiving a third grant of a third set of resources for a third uplink transmission;
identifying a non-overlap condition between the third set of resources and the first set of resources; and
processing the third grant based at least in part on the identifying the non-overlap condition.

22. The method of claim 21, further comprising:
determining that the third set of resources and the first set of resources at least partially overlap in time; and
identifying the third grant of the third set of resources as an error.

23. The method of claim 21, further comprising:
determining that the third set of resources and the first set of resources at least partially overlap in time;
encoding the transport block for the first uplink transmission using a first processing block based at least in part on the first uplink transmission corresponding to a first priority;
encoding an additional transport block for the third uplink transmission using a second processing block based at least in part on the third uplink transmission corresponding to a second priority different from the first priority; and
transmitting the third uplink transmission during time resources that at least partially overlap with the first set of resources.

* * * * *